United States Patent
Saka

(10) Patent No.: US 11,658,071 B2
(45) Date of Patent: May 23, 2023

(54) SEMICONDUCTOR DEVICE, METHOD OF MANUFACTURING SEMICONDUCTOR DEVICE, AND ELECTRONIC APPARATUS

(71) Applicant: SONY SEMICONDUCTOR SOLUTIONS CORPORATION, Kanagawa (JP)

(72) Inventor: Naoki Saka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 355 days.

(21) Appl. No.: 16/753,678

(22) PCT Filed: Sep. 4, 2018

(86) PCT No.: PCT/JP2018/032715
§ 371 (c)(1),
(2) Date: Apr. 3, 2020

(87) PCT Pub. No.: WO2019/073719
PCT Pub. Date: Apr. 18, 2019

(65) Prior Publication Data
US 2020/0294857 A1 Sep. 17, 2020

(30) Foreign Application Priority Data
Oct. 13, 2017 (JP) .............................. JP2017-199193

(51) Int. Cl.
*H01L 27/12* (2006.01)
*H01L 27/088* (2006.01)
(Continued)

(52) U.S. Cl.
CPC ........ *H01L 21/786* (2013.01); *H01L 21/8226* (2013.01); *H01L 29/786* (2013.01)

(58) Field of Classification Search
CPC ........... H01L 27/14634; H01L 27/1266; H01L 27/14623; H01L 27/04; H01L 23/552;
(Continued)

(56) References Cited

U.S. PATENT DOCUMENTS 9,755,029 B1  9/2017 Goktepeli
2014/0084290 A1  3/2014 Allibert et al.

FOREIGN PATENT DOCUMENTS

CN  103460371 A  12/2013
EP  2689453 A1  1/2014
(Continued)

OTHER PUBLICATIONS

International Search Report and Written Opinion of PCT Application No. PCT/JP2018/032715, dated Nov. 27, 2018, 09 pages of ISRWO.

(Continued)

*Primary Examiner* — Selim U Ahmed
(74) *Attorney, Agent, or Firm* — Chip Law Group

(57) ABSTRACT

To more reliably suppress deterioration in characteristics due to signals (distortions) other than input and output waves while suppressing manufacturing cost. A semiconductor device according to the present disclosure includes a circuit substrate including an insulating film layer located above a predetermined semiconductor substrate and a semiconductor layer located above the insulating film layer, a plurality of passive elements provided on the circuit substrate and electrically connected with one another, and an electromagnetic shield layer locally provided in the insulating film layer corresponding to a portion where at least one of the plurality of passive elements is provided, and the electromagnetic shield layer and the semiconductor substrate are electrically separated from each other.

19 Claims, 19 Drawing Sheets

(51) Int. Cl.
   *H01L 21/786* (2006.01)
   *H01L 21/8226* (2006.01)
   *H01L 29/786* (2006.01)

(58) Field of Classification Search
   CPC . H01L 21/786; H01L 21/8226; H01L 29/786;
            H01L 21/823475; H01L 27/088; H01L
            21/76254; H01L 21/265; H01L 21/3205;
            H01L 21/76243; H01L 21/76264; H01L
            21/768; H01L 21/84; H01L 23/522; H01L
            27/1203; H01L 27/1207; H01L 29/78648
   See application file for complete search history.

(56) References Cited

FOREIGN PATENT DOCUMENTS

| | | |
|---|---|---|
| FR | 2973158 A1 | 9/2012 |
| JP | 2000-058844 A | 2/2000 |
| JP | 2014-509087 A | 4/2014 |
| KR | 10-2014-0027153 A | 3/2014 |
| SG | 193529 A1 | 10/2013 |
| TW | 201308396 A | 2/2013 |
| WO | 2012/127006 A1 | 9/2012 |
| WO | 2017/222726 A1 | 12/2017 |

OTHER PUBLICATIONS

Bonnevialle, et al., "Smart Solutions for Efficient Dual Strain Integration for Future FDSOI Generations", IFFF Symposium on VLSI Technology, Sep. 22, 2016, 01 page.

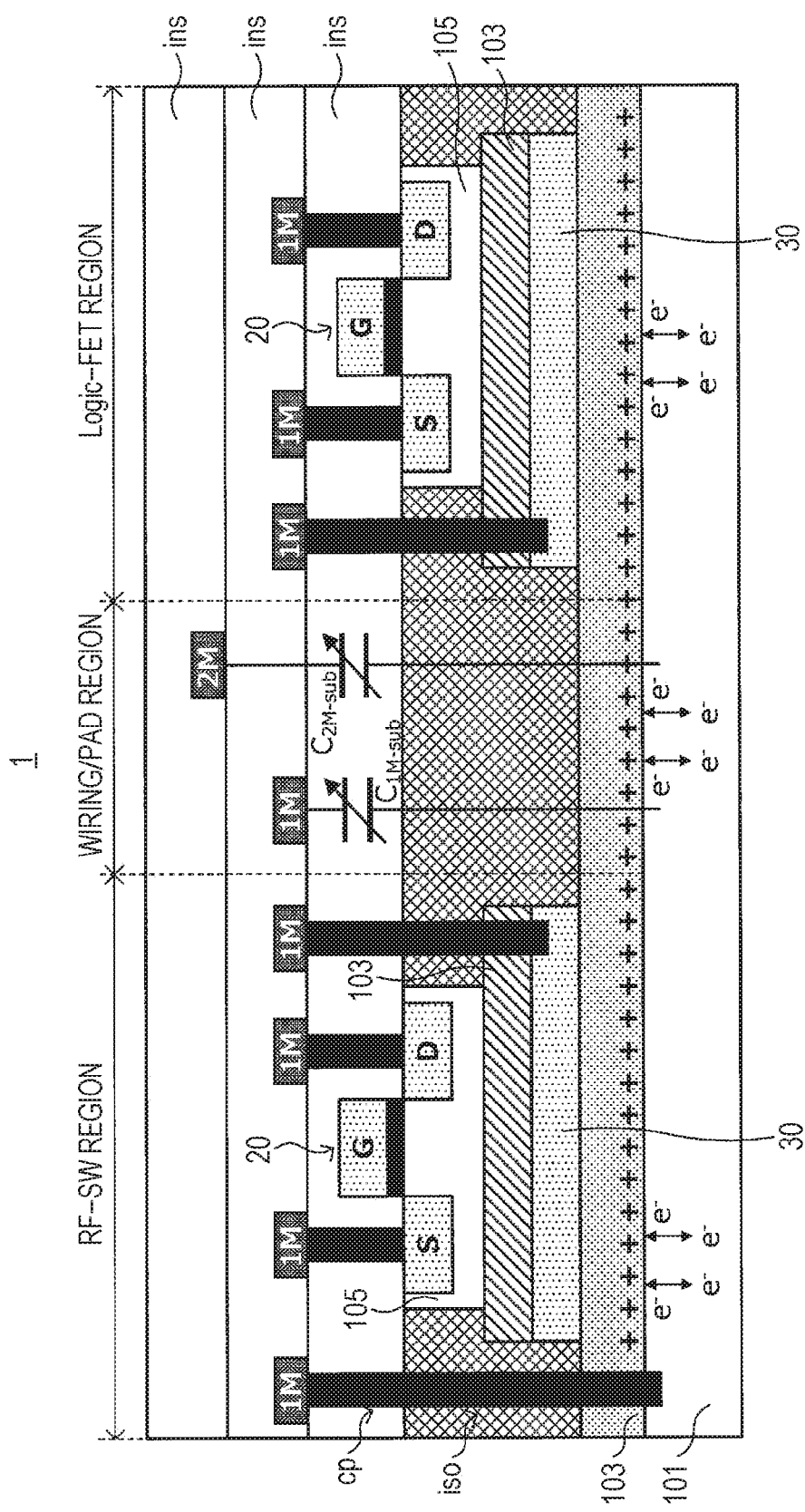

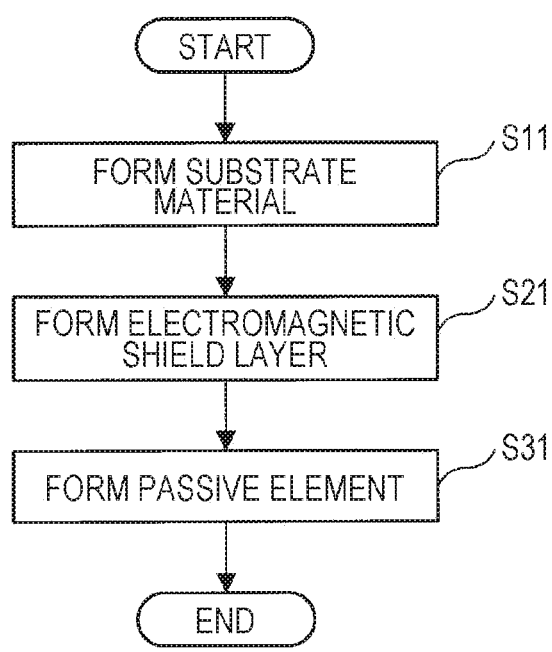

SEMICONDUCTOR DEVICE, METHOD OF MANUFACTURING SEMICONDUCTOR DEVICE, AND ELECTRONIC APPARATUS

CROSS REFERENCE TO RELATED APPLICATIONS

This application is a U.S. National Phase of International Patent Application No. PCT/JP2018/032715 filed on Sep. 4, 2018, which claims priority benefit of Japanese Patent Application No. JP 2017-199193 filed in the Japan Patent Office on Oct. 13, 2017. Each of the above-referenced applications is hereby incorporated herein by reference in its entirety.

TECHNICAL FIELD

The present disclosure relates to a semiconductor device, a method of manufacturing a semiconductor device, and an electronic apparatus.

BACKGROUND ART

Conventionally, RF switches for turning on and off a radio frequency (RF) have been used in front ends of communication devices such as mobile phones. Such an RF switch generally has a structure of a substrate having a high resistance value and a box layer (buried oxide layer) of $SiO_2$ or the like provided on the substrate. An interface between the substrate and the box layer is positively charged due to defects, and minute electrons in the negatively charged substrate are often attracted to the interface between the substrate and the box layer.

Here, one of the most important characteristics required for an RF switch is not to generate signals (distortions) other than input and output waves. One of the causes of generation of such a distortion is occurrence of nonlinearity of capacitance due to repetition of capture and emission of the electrons attracted to the interface between the substrate and the box layer. Due to such repetition of capture and emission of electrons, a radio frequency distortion and an intermodulation distortion are generated and the characteristics of the RF switch deteriorate.

To suppress generation of the above-described distortions, it is important to minimize the capture and emission of the electrons at the interface between the substrate and the box layer. Therefore, for example, Patent Document 1 below proposes suppression of generation of the above-described distortions by providing a trap rich layer having more traps than electrons such as a polycrystalline silicon (polysilicon) layer between a substrate and a box layer, and causing the trap rich layer to intentionally capture electrons to suppress emission of electrons.

CITATION LIST

Patent Document

Patent Document 1: PCT Japanese Translation Patent Publication No. 2014-509087

SUMMARY OF THE INVENTION

Problems to be Solved by the Invention

However, even if the above-described trap rich layer is provided, generation of signals (distortions) other than input and output waves cannot be sufficiently suppressed, and a technology capable of more effectively suppressing generation of distortions has been wanted. Furthermore, use of a quartz substrate is conceivable to suppress generation of the above-described distortions but the quartz substrate is more expensive than a silicon on insulator (SOI) substrate that has been conventionally used as an RF switch substrate, and thus there is a concern about an increase in cost.

Therefore, the present disclosure proposes, in view of the above circumstances, a semiconductor device, a method of manufacturing a semiconductor device, and an electronic apparatus capable of reliably suppressing deterioration in characteristics due to signals (distortions) other than input and output waves while suppressing manufacturing cost.

Solutions to Problems

According to the present disclosure, provided is a semiconductor device including: a circuit substrate including an insulating film layer located above a predetermined semiconductor substrate and a semiconductor layer located above the insulating film layer; a plurality of passive elements provided on the circuit substrate and electrically connected with one another; and an electromagnetic shield layer locally provided in the insulating film layer corresponding to a portion where at least one of the plurality of passive elements is provided, the electromagnetic shield layer and the semiconductor substrate being electrically separated from each other.

Furthermore, according to the present disclosure, provided is a method of manufacturing a semiconductor device, the method including: forming a substrate material having a stacked structure including a first insulating film layer located on a predetermined semiconductor substrate, a first semiconductor layer located on the first insulating film layer, a second insulating film layer located on the first semiconductor layer, and a second semiconductor layer located on the second insulating film layer, and the stacked structure being device-isolated; doping the first semiconductor layer in the substrate material to form an electromagnetic shield layer electrically separated from the semiconductor substrate; and forming a plurality of passive elements electrically connected with one another, using the second semiconductor layer.

Furthermore, according to the present disclosure, provided is an electronic apparatus including: a semiconductor device including a circuit substrate including an insulating film layer located above a predetermined semiconductor substrate and a semiconductor layer located above the insulating film layer, a plurality of passive elements provided on the circuit substrate and electrically connected with one another, and an electromagnetic shield layer locally provided in the insulating film layer corresponding to a portion where at least one of the plurality of passive elements is provided, the electromagnetic shield layer, the semiconductor substrate being electrically separated from each other.

According to the present disclosure, the electromagnetic shield layer locally provided in the insulating film layer corresponding to the portion where the passive element is provided cuts a noise generated due to inversion electrons caused at an interface between a substrate and a box (buried oxide) layer.

Effects of the Invention

As described above, according to the present disclosure, a method of manufacturing a semiconductor device, and an electronic apparatus capable of reliably suppressing deterioration in characteristics due to signals (distortions) other than input and output waves while suppressing manufacturing cost can be provided.

Note that the above-described effect is not necessarily restrictive, and any one of effects described in the present specification or any another effect obtainable from the present specification may be exhibited in addition to or in place of the above-described effect.

BRIEF DESCRIPTION OF DRAWINGS

FIG. 8A is an explanatory diagram schematically illustrating a configuration example of the semiconductor device according to the embodiment.

FIG. 9 is a flowchart illustrating an example of a flow of a method of manufacturing the semiconductor device according to the embodiment.

MODE FOR CARRYING OUT THE INVENTION

A favorable embodiment of the present disclosure will be described in detail with reference to the appended drawings. Note that, in the present specification and drawings, redundant description of configuration elements having substantially the same functional configuration is omitted by providing the same sign.

Note that the description will be given in the following order.

1. Content of Study by Present Inventor
2. Embodiment
2.1. Configuration of Semiconductor Device
2.2. Method of Manufacturing Semiconductor Device
2.3. Application Example of Semiconductor Device (Content of Study by Present Inventor)

Prior to describing a semiconductor device, a method of manufacturing a semiconductor device, and an electronic apparatus according to an embodiment of the present disclosure, content of study conducted by the present inventor in order to solve the problems will be described in detail with reference to FIGS. 1A, 1B, 2A, 2B, 2C, 2D, 2E, 3, 4, 5A, 5B, and 5C.

<RF Switch as Example of Semiconductor Device>

Hereinafter, first, an RF switch as an example of a semiconductor device will be described with reference to FIGS. 1A, 1B, 2A, 2B, 2C, 2D, 2E, and 3.

Figure 1A:
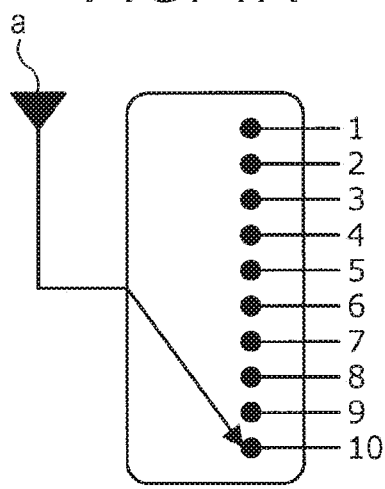
FIG. 1A is an explanatory diagram schematically illustrating an RF switch having an SPNT configuration.
Figure 1B:
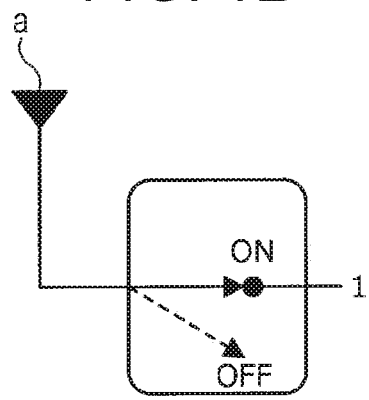
FIG. 1B is an explanatory diagram schematically illustrating an RF switch having an SPST configuration.
Figure 2A:
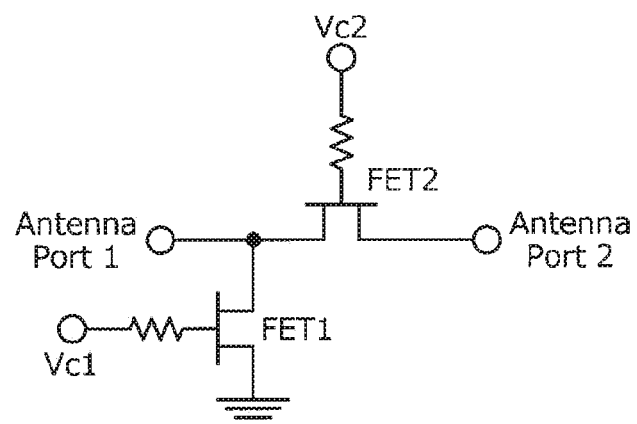
FIG. 2A is an explanatory diagram schematically illustrating a basic circuit configuration of the RF switch having an SPST configuration.
Figure 2B:
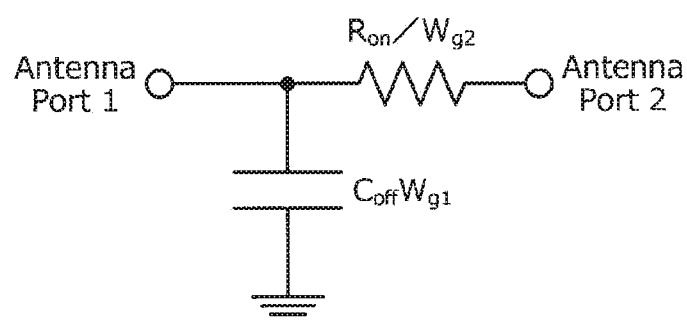
FIG. 2B is an explanatory diagram for describing the basic circuit configuration of the RF switch having an SPST configuration.
Figure 2C:
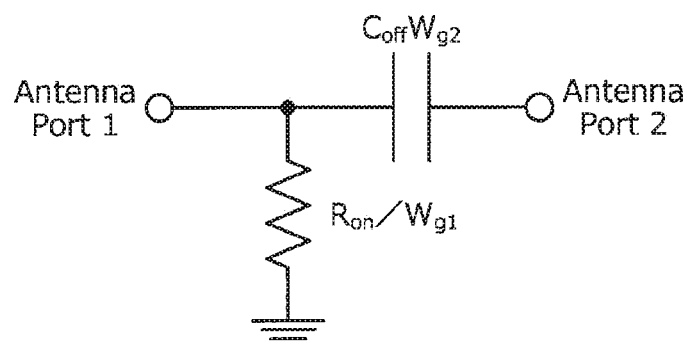
FIG. 2C is an explanatory diagram for describing the basic circuit configuration of the RF switch having an SPST configuration.
Figure 2D:
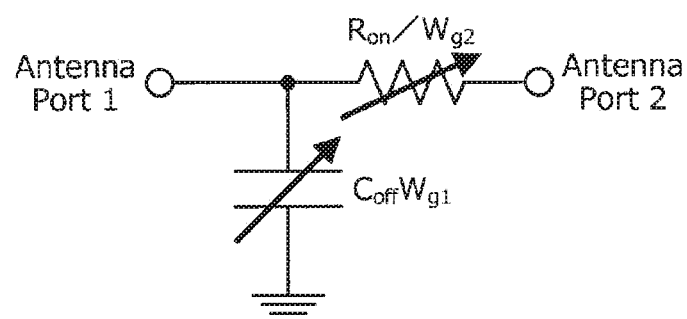
FIG. 2D is an explanatory diagram for describing the basic circuit configuration of the RF switch having an SPST configuration.
Figure 2E:
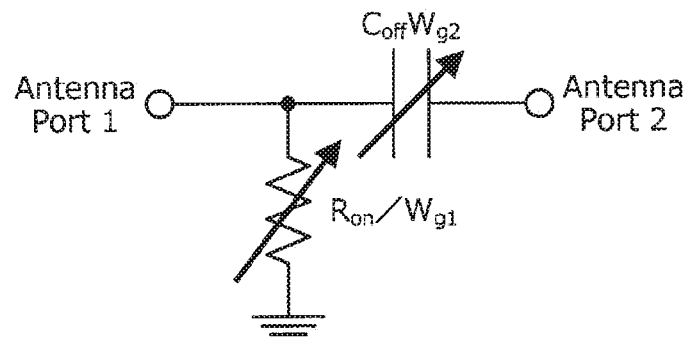
FIG. 2E is an explanatory diagram for describing the basic circuit configuration of the RF switch having an SPST configuration.
Figure 3:
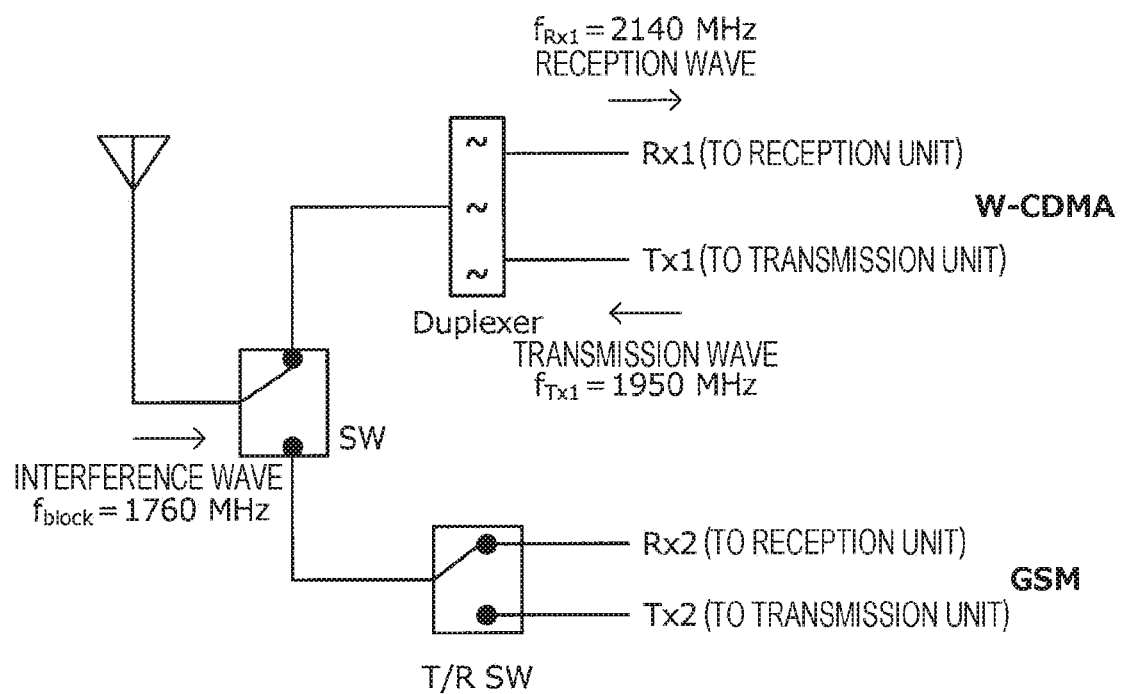
FIG. 3 is a conceptual diagram of a multi-band switch compatible with W-CDMA and GSM (registered trademark).

FIG. 1A is an explanatory diagram schematically illustrating an RF switch having an SPNT configuration, and FIG. 1B is an explanatory diagram schematically illustrating an RF switch having an SPST configuration. FIG. 2A is an explanatory diagram schematically illustrating a basic circuit configuration of the RF switch having an SPST configuration, and FIGS. 2B, 2C, 2D, and 2E are explanatory diagrams for describing the basic circuit configuration of the RF switch having an SPST configuration FIG. 3 is a conceptual diagram of a multi-band switch compatible with W-CDMA and GSM (registered trademark).

As mentioned earlier, an RF switch (hereinafter sometimes abbreviated as "RF-SW") for turning on and off a radio frequency is used in front ends of various communication apparatuses such as mobile phones. The RF switch has various configurations such as single pole single through (SPST), single pole double through (SPDT), SP3T, . . . , and SPNT (N is an integer) depending on the number of input/output ports. For example, FIG. 1A schematically illustrates an RF switch having an SP10T configuration in which the number of ports N connected to an antenna a is N=10, and FIG. 1B schematically illustrates an RF switch having an SPST configuration (N=1) that is a basic configuration of the RF switch. Although RF switches having various configurations can be present, an RF switch having any of the configurations is an RF switch of a combination of SPST basic circuit configurations as illustrated in FIG. 1B.

FIG. 2A illustrates the basic circuit configuration of the RF switch having the SPST configuration. As illustrated in FIG. 2A, in the RF switch having the SPST configuration, ON and OFF control is performed by applying predetermined control voltages Vc1 and Vc2 to gates of field effect transistors FET1 and FET2 via resistors. An equivalent circuit at the time of ON can be illustrated as in FIG. 2B and an equivalent circuit at the time of OFF can be illustrated as in FIG. 2C, using an FET resistance value per unit length $R_{on}$ [Ωmm], an FET capacitance value per unit length $C_{off}$ [fF/mm], and a gate width Wg [mm]. On-resistance and off-capacitance are $R_{on}/W_{g2}$ and $C_{off}*W_{g2}$, respectively. The on-resistance is inversely proportional to $W_{g2}$ and the off-capacitance is proportional to $W_{g2}$.

Here, there are two most important characteristics required for the RF switch, and the first characteristic is not to generate signals (distortions) other than input and output waves and the second characteristic is to transmit the input and output waves with low loss.

<Distortion Generation Mechanism>

Next, hereinafter, an important distortion generation mechanism in the RF switch will be described in detail.

Distortions to focus on in the RF switch are a harmonic distortion and an intermodulation distortion. In an ideal system (for example, the RF switch), when an input wave (signal wave) having a frequency ($f_1$) is input, the frequency of an output wave becomes the frequency ($f_1$) only. However, in an actual system, a distortion is generated because the off-capacitance and the on-resistance have nonlinearity, as illustrated in FIGS. 2D and 2E. When the signal having the specific frequency $f_1$ has passed through the nonlinear system, signals having not only the frequency $f_1$ but also frequency components unnecessary for the system are generated as signals output from the system. When the frequency of the input wave $f_1$ is a fundamental wave, a distortion having twice the frequency is called a second harmonic distortion, and a distortion having n times the frequency is called an n-th harmonic distortion.

Furthermore, in a case where two input waves $f_1$ and $f_2$ have passed through the nonlinear system, secondary harmonics having frequencies $2f_1$ and $2f_2$ are generated and frequency components $2f_1-f_2$ and $2f_2-f_1$ are generated according to the harmonics and the input waves $f_1$ and $f_2$. These generated frequency components are called third-order intermodulation distortion (IM3) because three input waves are involved. Similarly, in a case where two input waves $f_1$ and $f_2$ have passed through the nonlinear system, frequency components $3f_1-2f_2$ and $3f_2-2f_1$ are generated. These generated frequency components are called fifth-order intermodulation distortion (IM5) because five input waves are involved.

These intermodulation distortions are briefly and mathematically described as follows. Attention is paid to a case where two input signals ($V_1=E_1 \cos(\omega_1 t)$ and $V_2=E_2 \cos(\omega_2 t)$) having angular frequencies $\omega_1$ and $\omega_2$ are input to a nonlinear circuit such as the RF switch. Here, assuming that an output signal from the nonlinear circuit is represented as $V_0$, $V_0$ can be expressed by the following expression (1) in consideration of linear terms and nonlinear terms.

[Math. 1]

$$V_0 = a_0 + a_1 \cdot V_i + a_2 \cdot V_i^2 + a_3 \cdot V_i^3 + \ldots \qquad \text{Expression (1)}$$

Here, by substituting two input signals ($V_1=E_1 \cos(\omega_1 t)$ and $V_2=E_2 \cos(\omega_2 t)$) into the above expression (1), the following expression (3) can be obtained.

[Math. 2]

$$\begin{aligned}
V_0 = {} & a_0 + a_1 \cdot E_1 \cdot \cos\omega_1 t + a_2 \cdot E_2 \cdot \cos\omega_2 t + \\
& \frac{a_2}{2}(E_1^2 + E_2^2) + \frac{a_2}{2}(E_1^2 \cdot \cos 2\omega_1 t + E_2^2 \cdot \cos 2\omega_2 t) + \\
& a_2 \cdot E_1 \cdot E_2 \{\cos(\omega_1 - \omega_2)t + \cos(\omega_1 + \omega_2)t\} + \\
& a_3\left(\frac{3}{4}E_1^3 + \frac{3}{2}E_1 \cdot E_2^2\right) \cdot \cos\omega_1 t + a_3\left(\frac{3}{4}E_2^3 + \frac{3}{2}E_1^2 \cdot E_2\right) \cdot \cos\omega_2 t - \\
& \frac{a_3}{4}E_1^3 \cdot \cos 3\omega_1 t - \frac{a_3}{4}E_2^3 \cdot \cos 3\omega_2 t + \\
& \frac{3}{4}a_3 \cdot E_1^2 \cdot E_2 \{\cos(2\omega_1 - \omega_2)t - \cos(2\omega_t + \omega_2)t\} + \\
& \frac{3}{4}a_3 \cdot E_1 \cdot E_2^2 \{\cos(2\omega_2 - \omega_1)t - \cos(2\omega_2 + \omega_1)t\} + \ldots
\end{aligned}$$

Expression (3)

In the above expression (3), the terms involving a coefficient $a_0$ and a coefficient $a_1$ correspond to the linear terms, and the terms involving a coefficient $a_2$ and thereafter correspond to the nonlinear terms. In the above expression (3), looking at the third-order nonlinear terms involving a coefficient $a_3$, there are terms having an angular frequency $(2\omega_1-\omega_2)$ or $(2\omega_2-\omega_1)$. A nonlinear component caused by these terms corresponds to the third-order intermodulation distortion (IM3). Similarly, in the above expression (1), the distortion caused by a fifth-order nonlinear component is the fifth-order intermodulation distortion (IM5). Thus, in the nonlinear circuit, signals that are originally not present such as the third-order intermodulation distortion (IM3) and the fifth-order intermodulation distortion (IM5) are arbitrarily generated inside the nonlinear circuit.

The phenomenon of attention is not solved even by using a filter that cuts the harmonic distortion and the intermodulation distortion generated from the nonlinear system. The reason will be briefly described with reference to FIG. 3.

Assume that a reception wave frequency $f_{Rx1}$ of W-CDMA is 2140 MHz, and a transmission wave frequency $f_{Tx1}$ of W-CDMA is 1950 MHz. A duplexer plays a role of a filter that passes only a signal having the frequency of 2140 MHz or a signal having the frequency of 1950 MHz. Meanwhile, signals having various frequencies are present in the atmosphere. For example, when an interference wave having a frequency $f_{block}=1760$ MHz and the transmission wave having the frequency of 1950 MHz are simultaneously input to a switch (SW) having a nonlinear component, a third-order distortion component ($2f_{Tx1}-f_{block}=2\times1950-1760=2140$ MHz) is generated. Since the frequency of the third-order distortion component is the same as the reception wave frequency $f_{Rx1}$, the third-order distortion component can pass through the duplexer and becomes a noise source. That is, since a W-CDMA system is always in an ON state, noise flows into a transmission/reception circuit when the intermodulation distortion is generated. Therefore, implementation of a semiconductor device that does not fundamentally generate the harmonic distortion and the intermodulation distortion is wanted. That is, it is understood that reduction of the nonlinear components of the on-resistance $R_{on}$ and the off-capacitance $C_{off}$ as illustrated in FIGS. 2D and 2E is important.

Figure 4:
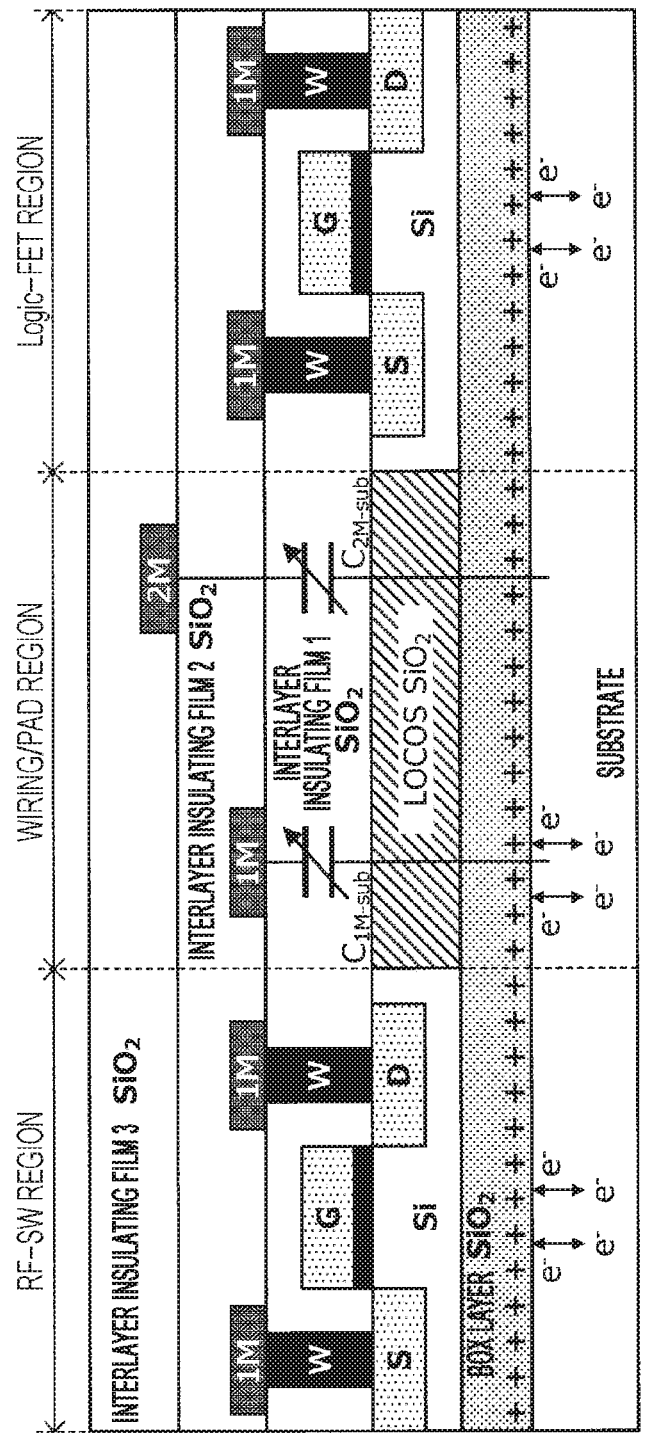
FIG. 4 is an explanatory diagram schematically illustrating an example of a structure of an RF switch using an SOI substrate.

FIG. 4 is an explanatory diagram schematically illustrating an example of a structure of an RF switch using an SOI substrate. Here, in FIG. 4, notations "S", "D", and "G" represent a source electrode, a drain electrode, and a gate electrode of a transistor, respectively, and a notation "W" represents a tungsten contact plug. Furthermore, notations "1M" and "2M" represent wiring using metal or the like.

An SOI RF-SW system as illustrated in FIG. 4 is roughly divided into (a) an RF switch region (RF-SW region) that is a main system, (b) wiring or a PAD region, and (c) a logic transistor region (Logic-FET region) for driving an RF-SW. Furthermore, the RF-SW region and the Logic-FET region are device-isolated by an $SiO_2$ layer ("LOCOS $SiO_2$" in FIG. 4). Furthermore, in the wiring or the PAD region, a nonlinear capacitance component $C_{1M-sub}$ regarding the wiring 1M and a substrate and a nonlinear capacitance component $C_{2M-sub}$ regarding the wiring 2M and the substrate, as illustrated in FIG. 4, may be generated. Moreover, an interface between the substrate (typically, a substrate having a high resistivity is used) and a box layer (a buried oxide layer, for example, $SiO_2$ layer) is positively charged due to defects, and minute electrons in the negative substrate are attracted to the interface.

Figure 5A:
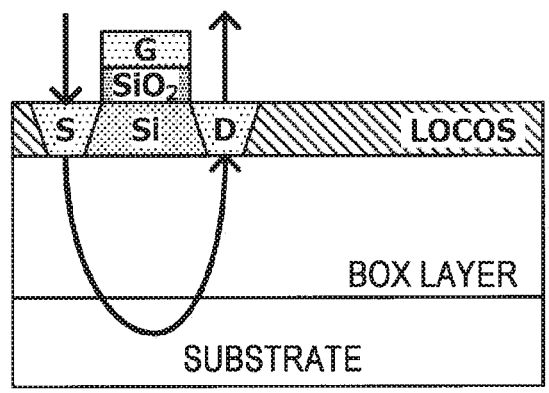
FIG. 5A is an explanatory diagram for describing a noise source of an RF switch.
Figure 5B:
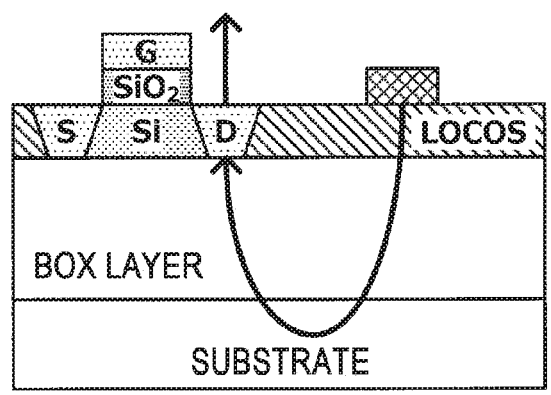
FIG. 5B is an explanatory diagram for describing a noise source of an RF switch.
Figure 5C:
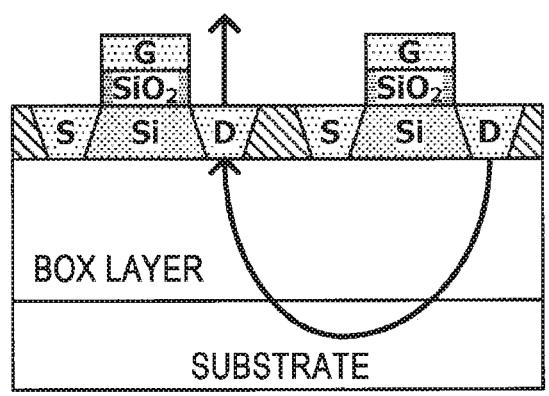
FIG. 5C is an explanatory diagram for describing a noise source of an RF switch.

The nonlinear capacitance components as described earlier include (A) a component generated as the thickness of a depletion layer changes as an RF signal passes through the RF-SW region, and (B) a component generated as capture and emission of the electrons attracted to the interface between the box layer and the substrate is repeated due to the RF signal and Logic noise having entered the substrate. FIGS. 5A, 5B, and 5C schematically illustrate a state in which the harmonic distortion and the intermodulation distortion are superimposed due to a signal line of the RF signal and Logic noise having entered the substrate. FIGS. 5A, 5B, and 5C are explanatory diagrams for describing a noise source of the RF switch.

FIG. 5A schematically illustrates a state in which an interference wave present in the atmosphere enters the source electrode S from an antenna and travels along the substrate, FIG. 5B schematically illustrates a path in which a signal fed back through the wiring returns along the substrate, and FIG. 5C schematically illustrates a path in which the Logic noise from the Logic-FET region enters along the substrate. Capacitance nonlinearity is generated as the capture and emission of the electrons attracted to the interface between the box layer and the substrate is repeated due to the noise signal having entered the substrate as illustrated in FIGS. 5A, 5B, and 5C, and the harmonic distortion and the intermodulation distortion are generated.

To suppress generation of the above-described distortions, it is important to minimize the capture and emission of the electrons at the interface between the substrate and the box layer. Therefore, as mentioned earlier, generation of the above-described distortions is suppressed by providing a trap rich layer having more traps than electrons such as a polycrystalline silicon (polysilicon) layer between the substrate and the box layer, and causing the trap rich layer to intentionally capture electrons to suppress emission of electrons.

However, even if the above-described trap rich layer is provided, generation of signals (distortions) other than input and output waves cannot be sufficiently suppressed, and a technology capable of more effectively suppressing generation of distortions has been wanted. Furthermore, use of a quartz substrate is conceivable to suppress generation of the above-described distortions but the quartz substrate is more expensive than a silicon on insulator (SOI) substrate that has been conventionally used as an RF switch substrate, and thus there is a concern about an increase in cost.

Therefore, the present inventor has intensively studied a technology capable of more reliably suppressing deterioration in characteristics due to signals (distortions) other than input and output waves while suppressing manufacturing cost. As a result, the present inventor has reached an idea that it is enough that a distortion caused by inversion electrons at the interface between the substrate and the box layer is not transmitted to a passive element such as a switching transistor even if a conventional trap rich layer is not provided. As a result of further study by the present inventor on the basis of such an idea, the present inventor has conceived of constructing an electromagnetic shield layer for shielding the distortion caused by inversion electrons, and has completed a semiconductor device and a method of manufacturing a semiconductor device according to an embodiment of the present disclosure as described below.

Hereinafter, a semiconductor device, a method of manufacturing a semiconductor device, and an electronic apparatus according to an embodiment of the present disclosure will be described in detail.

EMBODIMENT

<Basic Configuration of Semiconductor Device>

Hereinafter, a basic configuration of the semiconductor device according to the embodiment of the present disclosure will be described in detail with reference to FIGS. 6A, 6B, 7A, 7B, and 7C.

Figure 6A:
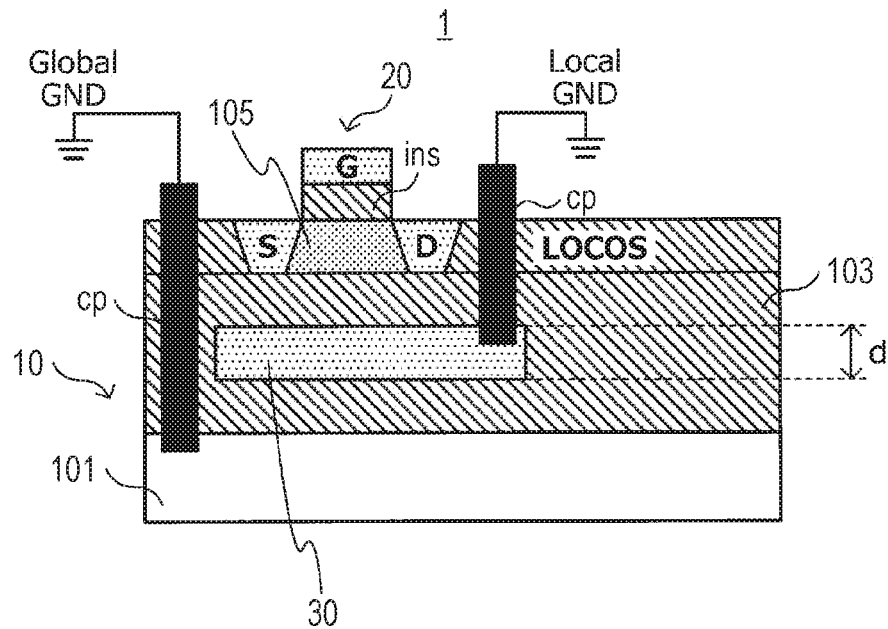
FIG. 6A is an explanatory diagram schematically illustrating an example of a configuration of a semiconductor device according to an embodiment of the present disclosure.
Figure 6B:
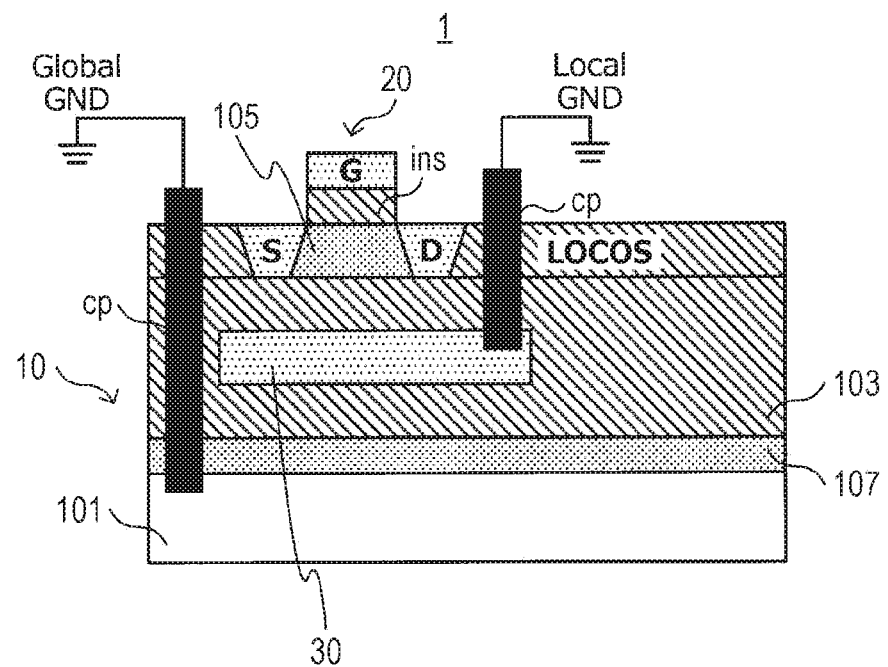
FIG. 6B is an explanatory diagram schematically illustrating another example of a configuration of the semiconductor device according to the embodiment.
Figure 7A:
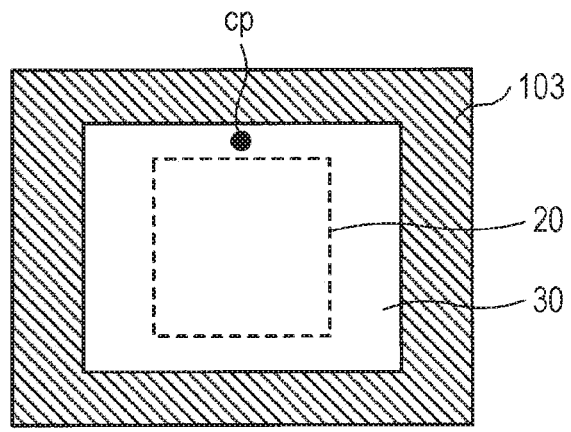
FIG. 7A is an explanatory diagram schematically illustrating a shape of an electromagnetic shield in the semiconductor device according to the embodiment.
Figure 7B:
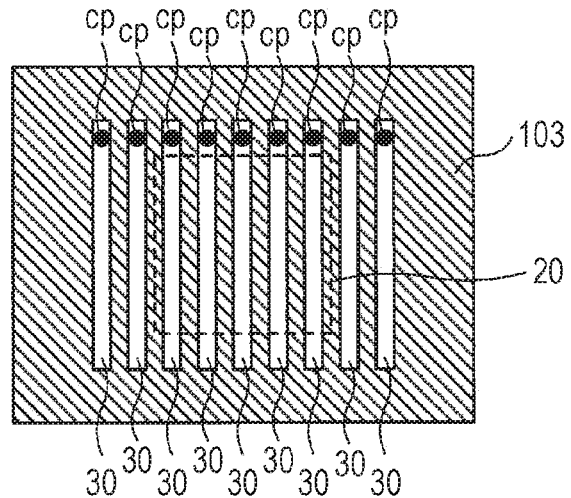
FIG. 7B is an explanatory diagram schematically illustrating a shape of an electromagnetic shield in the semiconductor device according to the embodiment.
Figure 7C:
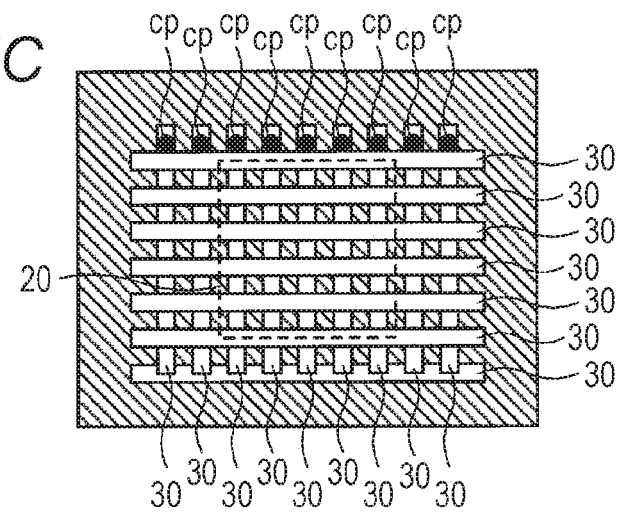
FIG. 7C is an explanatory diagram schematically illustrating a shape of an electromagnetic shield in the semiconductor device according to the embodiment.

FIG. 6A is an explanatory diagram schematically illustrating an example of a configuration of the semiconductor device according to the present embodiment and FIG. 6B is an explanatory diagram schematically illustrating another example of a configuration of the semiconductor device according to the present embodiment. FIGS. 7A, 7B, and 7C are explanatory diagrams schematically illustrating a shape of an electromagnetic shield in the semiconductor device according to the embodiment.

A semiconductor device 1 according to the present embodiment can more reliably suppress deterioration in characteristics due to signals (distortions) other than input and output waves, and can be favorably used in implementing the RF switch.

The semiconductor device 1 includes a circuit substrate 10 and a plurality of passive elements 20 provided on the circuit substrate 10 and electrically connected to one another.

The circuit substrate 10 includes an insulating film layer 103 located above a predetermined semiconductor substrate 101 and a semiconductor layer 105 located above the insulating film layer 103, as schematically illustrated in FIG. 6A. Furthermore, the semiconductor substrate 101 is connected to a Grobal GND (that is, grounded) via a known contact plug cp such as a tungsten contact plug.

Furthermore, the semiconductor device 1 according to the present embodiment is provided with an electromagnetic shield layer 30 locally provided in the insulating film layer 103 corresponding to a portion where the passive element 20 is provided, as schematically illustrated in FIG. 6A. The electromagnetic shield layer is connected to a local GND via a known contact plug cp such as a tungsten contact plug. As described above, in the semiconductor device 1 according to the present embodiment, the electromagnetic shield layer 30 and the semiconductor substrate 101 are electrically separated from each other.

Moreover, the semiconductor device 1 according to the present embodiment may be provided with a known trap rich layer 107 between the semiconductor substrate 101 and the insulating film layer 103, as schematically illustrated in FIG. 6B.

Hereinafter, these configurations will be described in detail.

[Circuit Substrate 10]

The semiconductor substrate 101 of the circuit substrate 10 functions as a base material of the semiconductor device 1 according to the present embodiment. The semiconductor substrate 101 is not particularly limited, and any semiconductor substrate can be used as long as the semiconductor substrate functions as a semiconductor. Examples of such a semiconductor substrate 101 include an Si substrate, a Ge substrate, an SiGe substrate, a group III-V semiconductor substrate, a group III nitride semiconductor substrate, and an SiC substrate.

Furthermore, the semiconductor substrate 101 is favorably a semiconductor substrate having a high resistivity (more specifically, an effective electrical resistivity) that is over 500 Ωcm. Here, the effective electric resistivity is a resistivity of a resistive element of the same quality in an equivalent electric circuit, and can be measured using a known measuring method. When the semiconductor substrate 101 has the above-described resistivity, a parasitic capacitance of the semiconductor device 1 can be further reduced. The resistivity of the semiconductor substrate 101 is more favorably over 1000 Ωcm, and is further favorably over 3000 Ωcm. Note that an upper limit of the resistivity of the semiconductor substrate 101 is not particularly limited, and the larger the resistivity, the better the semiconductor substrate 101.

The insulating film layer 103 is a layer that functions as a box layer (buried oxide layer) in the semiconductor device 1, and is formed using, for example, an oxide of a semiconductor substance used as the semiconductor substrate 101, and the like. For example, in a case where the semiconductor substrate 101 is an Si substrate (more favorably, a high-resistance Si substrate (HR-Si substrate)), it is convenient to form the insulating film layer 103 using $SiO_2$.

The semiconductor layer 105 is located above the insulating film layer 103, and the semiconductor layer 105 is used in forming various passive elements 20. In the semiconductor device 1 according to the present embodiment, the material of the semiconductor layer 105 is not particularly limited, and any substance can be used as long as the substance functions as a semiconductor. Specific examples of the semiconductor layer 105 according to the embodiment include, for example, layers containing Si, Ge, SiGe, a group III-V semiconductor, a group III nitride semiconductor, and SiC.

Furthermore, the circuit substrate 10 according to the present embodiment may be provided with the known trap rich layer 107, as schematically illustrated in FIG. 6B, between the semiconductor substrate 101 and the insulating film layer 103. By providing the trap rich layer 107, electric field fluctuation caused by inversion electrons generated at the interface between the semiconductor substrate 101 and the insulating film layer 103 can be more reliably shielded.

Here, the material of the trap rich layer 107 is not particularly limited, and any material can be used as long as the material can be used as the trap rich layer 107. For example, in a case of realizing a Si-based semiconductor device 1, the trap rich layer 107 can be formed using polycrystalline silicon (polysilicon).

A doping concentration of the trap rich layer 107 is favorably, for example, equal to or less than $10^{16}$ cm$^{-3}$. By setting the doping concentration of the trap rich layer 107 to the concentration as described above, the electric field fluctuation caused by inversion electrons generated at the interface between the semiconductor substrate 101 and the insulating film layer 103 can be further more reliably shielded. The doping concentration of the trap rich layer 107 is more preferably equal to or less than $10^{14}$ cm$^{-3}$.

[Passive Element 20]

The passive element 20 is an element that passively functions in response to an applied signal or the like. Specific examples of the passive element 20 include, for example, a switching transistor, a power amplifier, a logic transistor, an inductor, and the like. In the semiconductor device 1 according to the present embodiment, a plurality of the passive elements 20 as described above is provided using the semiconductor layer 105 of the circuit substrate 10, and the passive elements 20 are electrically connected to one another. The specific configuration of the passive element 20 is not particularly limited, and the configuration of various known passive elements 20 using a known insulator ins, a known electrode material, and the like may be appropriately used. Note that the passive elements 20 may be connected in a direct current (DC) manner or in an alternating current (AC manner) manner.

[Electromagnetic Shield Layer 30]

In the semiconductor device 1 according to the present embodiment, the electromagnetic shield layer 30 is locally provided in the insulating film layer 103 corresponding to a portion where at least one passive element 20 of the plurality of passive elements 20 is provided. Here, the term "locally" means that the electromagnetic shield layer 30 is formed so as not to straddle a plurality of the passive elements 20 as illustrated in FIG. 6A, for example, and means that one electromagnetic shield layer 30 is formed corresponding to one passive element 20. That is, in the semiconductor device 1 according to the present embodiment, the electromagnetic shield layer 30 is not disposed below adjacent two passive elements 20 so as to straddle the two passive elements 20.

The electromagnetic shield layer 30 is electrically connected to the Local GND via the known contact plug cp, and is not electrically connected to the semiconductor substrate 101. As a result, the electric field fluctuation caused by inversion electrons generated at the interface between the semiconductor substrate 101 and the insulating film layer 103 can be shielded by the electromagnetic shield layer 30, and the generated electrolytic fluctuation falls to the Local GND. As described above, in the semiconductor device 1 according to the present embodiment, a layer (electromagnetic shield layer 30) having conductivity is intentionally disposed inside the insulating film layer 103. Thereby, generation of noises unnecessary as signals, such as the harmonic distortion and the intermodulation distortion, is more reliably suppressed, and the characteristics of the semiconductor device 1 can be further improved. As a result, in a case where such a semiconductor device 1 is applied to an RF switch, an ultra-low distortion RF-SW can be realized.

The electromagnetic shield layer 30 is formed favorably using a conductive or semiconductive material, and more favorably using a p-type or n-type doped semiconductor. By forming the electromagnetic shield layer 30 using such a material, the electric field fluctuation caused by inversion electrons generated at the interface between the semiconductor substrate 101 and the insulating film layer 103 can be more reliably shielded. For example, in a case of forming the electromagnetic shield layer 30 using Si as a material, the electromagnetic shield layer 30 may be formed using polycrystalline silicon (polysilicon), or the electromagnetic shield layer 30 may be formed using p-type doped Si (p-Si).

Here, the doping concentration of the electromagnetic shield layer 30 is favorably equal to or less than $10^{16}$ cm$^{-3}$. By setting the doping concentration of the electromagnetic shield layer 30 to be equal to or less than $10^{16}$ cm$^{-3}$, the electric field fluctuation caused by inversion electrons generated at the interface between the semiconductor substrate 101 and the insulating film layer 103 can be further more reliably shielded. The doping concentration of the electromagnetic shield layer 30 is more favorably equal to or less than $10^{14}$ cm$^{-3}$, and is further more favorably less than $10^{12}$ cm$^{-3}$.

Meanwhile, the electromagnetic shield layer 30 according to the present embodiment is formed favorably not using a metal. Various metals are materials having conductivity, but in a case where the electromagnetic shield layer 30 is formed using a metal, the electromagnetic shield layer 30 has capacitance, and implementation of a low-loss semiconductor device 1 becomes difficult.

Furthermore, the thickness (thickness d in FIG. 6A) of the electromagnetic shield layer 30 is favorably equal to or less than 100 nm. When the electromagnetic shield layer 30 has the above-described thickness, the electric field fluctuation caused by inversion electrons generated at the interface between the semiconductor substrate 101 and the insulating film layer 103 can be more reliably shielded. The thickness of the electromagnetic shield layer 30 is more favorably equal to or less than 50 nm.

Next, presence modes of the electromagnetic shield layer 30 according to the present embodiment will be briefly described with reference to FIGS. 7A, 7B, and 7C. The presence mode of the electromagnetic shield layer 30 according to the present embodiment (more specifically, the presence mode of the electromagnetic shield layer 30 in a direction perpendicular to the paper surface in the electromagnetic shield layer 30 illustrated in FIG. 6A) is not particularly limited, and the electromagnetic shield layer 30 can be present in any mode.

FIGS. 7A, 7B, and 7C schematically illustrate states in a case where the electromagnetic shield layer 30 according to the present embodiment is viewed from the passive element 20 side. The electromagnetic shield layer 30 according to the present embodiment may be entirely provided in a sheet-like manner in the insulating film layer 103 corresponding to a portion where the passive element is provided (a portion surrounded by the broken line in FIG. 7A), as illustrated in FIG. 7A. Furthermore, the electromagnetic shield layer 30 according to the present embodiment may be provided in a comb-like manner as illustrated in FIG. 7B, or may be provided in a mesh-liked manner as illustrated in FIG. 7C.

Note that a major axis direction of each electromagnetic shield layer 30 as illustrated in FIGS. 7B and 7C is not limited to the direction illustrated in FIGS. 7B and 7C, and may be inclined at a predetermined inclination angle.

The basic configuration of the semiconductor device according to the embodiment of the present disclosure has been described in detail with reference to FIGS. 6A, 6B, 7A, 7B, and 7C.

Note that FIGS. 6A and 6B illustrate the case in which the semiconductor substrate 101 is connected to the Grobal GND and the electromagnetic shield layer 30 is connected to the Local GND. However, the semiconductor substrate 101 and the electromagnetic shield layer 30 may be separately applied with a predetermined bias or both may be grounded. Note that in a case of applying a predetermined bias to the electromagnetic shield layer 30, the applied bias is favorably a constant bias without electrical fluctuation.

<Configuration Example of Semiconductor Device>

Figure 8B:
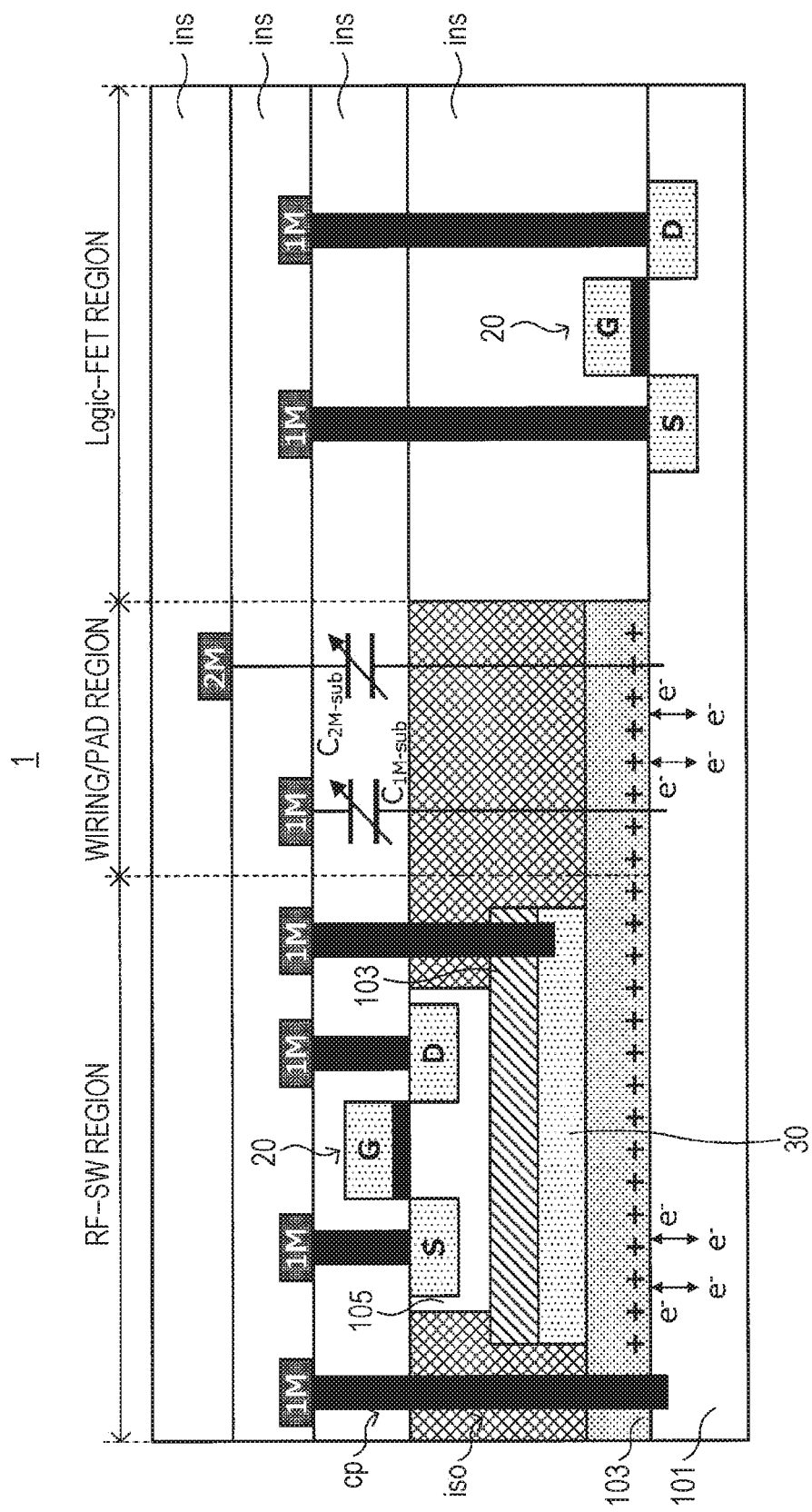
FIG. 8B is an explanatory diagram schematically illustrating another configuration example of the semiconductor device according to the embodiment.

Next, a more specific configuration example of the semiconductor device 1 according to the present embodiment will be briefly described with reference to FIGS. 8A and 8B. FIGS. 8A and 8B are explanatory diagrams schematically illustrating a configuration example of the semiconductor device according to the embodiment.

FIGS. 8A and 8B schematically illustrate, focusing on a semiconductor device used for an RF switch, a configuration example of a semiconductor device including the RF switch region (RF-SW region), the wiring or PAD region, the logic transistor region (Logic-FET region) for driving the RF-SW, using the structure of the semiconductor device according to the present embodiment.

The configuration of the semiconductor device 1 according to the present embodiment as described above can be applied to both the RF-SW region and the Logic-FET region, as illustrated in FIG. 8A, among semiconductor devices used for an RF switch. Furthermore, as illustrated in FIG. 8B, the configuration of the semiconductor device 1 according to the present embodiment can be applied only to the RF-SW region.

In either case of FIG. 8A or 8B, the RF-SW region, the wiring or PAD region, and the Logic-FET region are device-isolated by a device isolation structure iso using a known insulator such as SiO$_2$. The electromagnetic shield layers 30 provided corresponding to the respective passive element 20 is sandwiched by the insulating film layers 103. Moreover, the electromagnetic shield layer 30 is connected to the Local GND (not illustrated) via the known contact plug cp such as a tungsten contact plug. Furthermore, the semiconductor substrate 101 is connected to the Global GND (not illustrated) via the known contact plug cp such as a tungsten contact plug. Furthermore, the electrode structures (S, D, and G) of the passive element 20 and wiring (1M and 2M) are covered with the insulator ins such as SiO$_2$.

Here, as illustrated in FIG. 8A, by applying the configuration of the semiconductor device 1 according to the present embodiment to both the Logic-FET regions, the Logic noise as illustrated in FIG. 5C can be effectively prevented from reaching the substrate. Moreover, by applying the configuration of the semiconductor device 1 according to the present embodiment to the RF-SW region, a signal feedback from the wiring/PAD region as illustrated in FIG. 5B can be prevented. Therefore, the deterioration in characteristics due to signals (distortions) other than input and output waves can be further more reliably suppressed.

The configuration of the semiconductor device according to the present embodiment has been described in detail.

<Method of Manufacturing Semiconductor Device>
Next, a method of manufacturing the semiconductor device according to the present embodiment will be described in detail with reference to FIGS. 9, 10A 10B, 10C, 11, 12, 13, 14, 15, and 16.

Figure 10A:
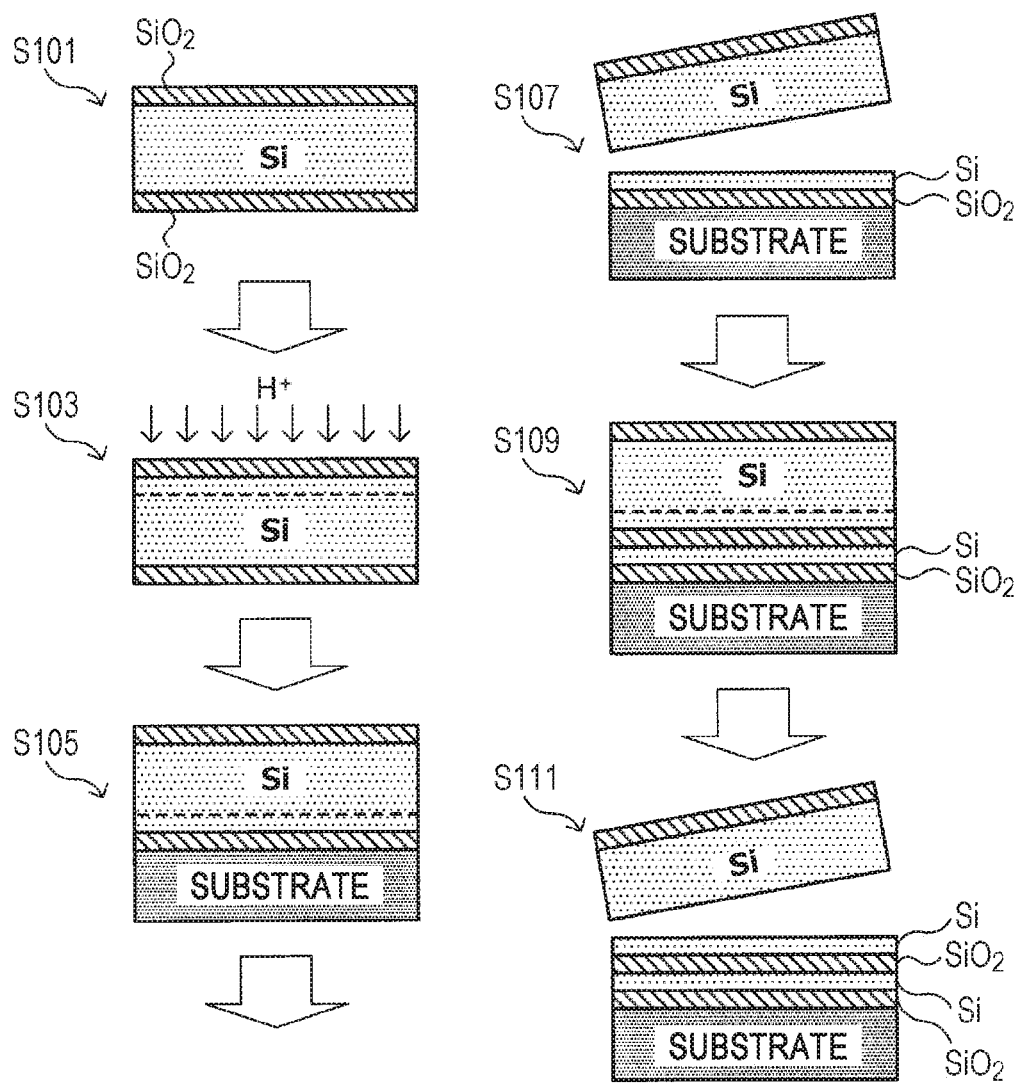
FIG. 10A is an explanatory diagram specifically illustrating an example of the method of manufacturing the semiconductor device according to the embodiment.
Figure 10B:
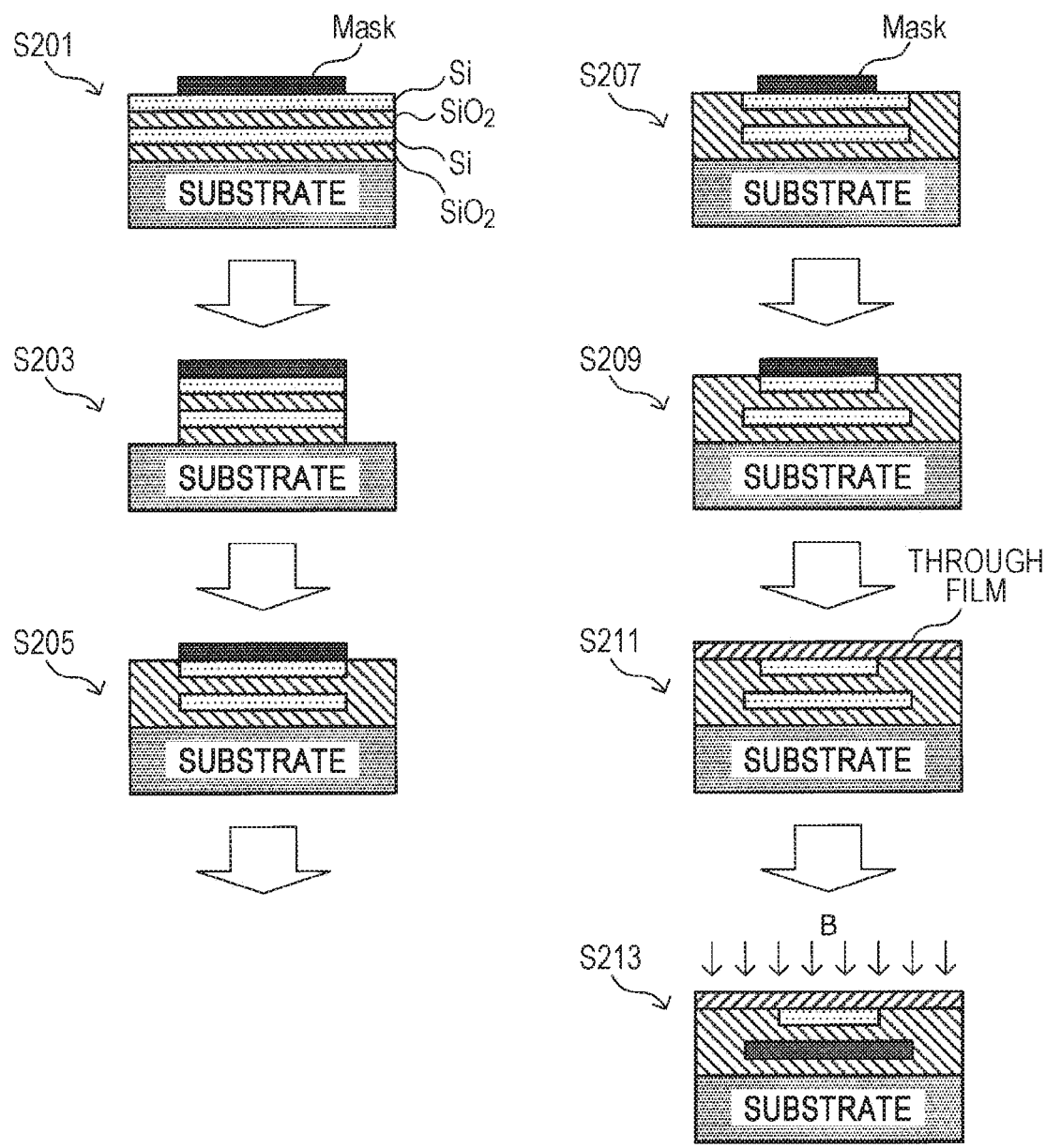
FIG. 10B is an explanatory diagram specifically illustrating an example of the method of manufacturing the semiconductor device according to the embodiment.
Figure 10C:
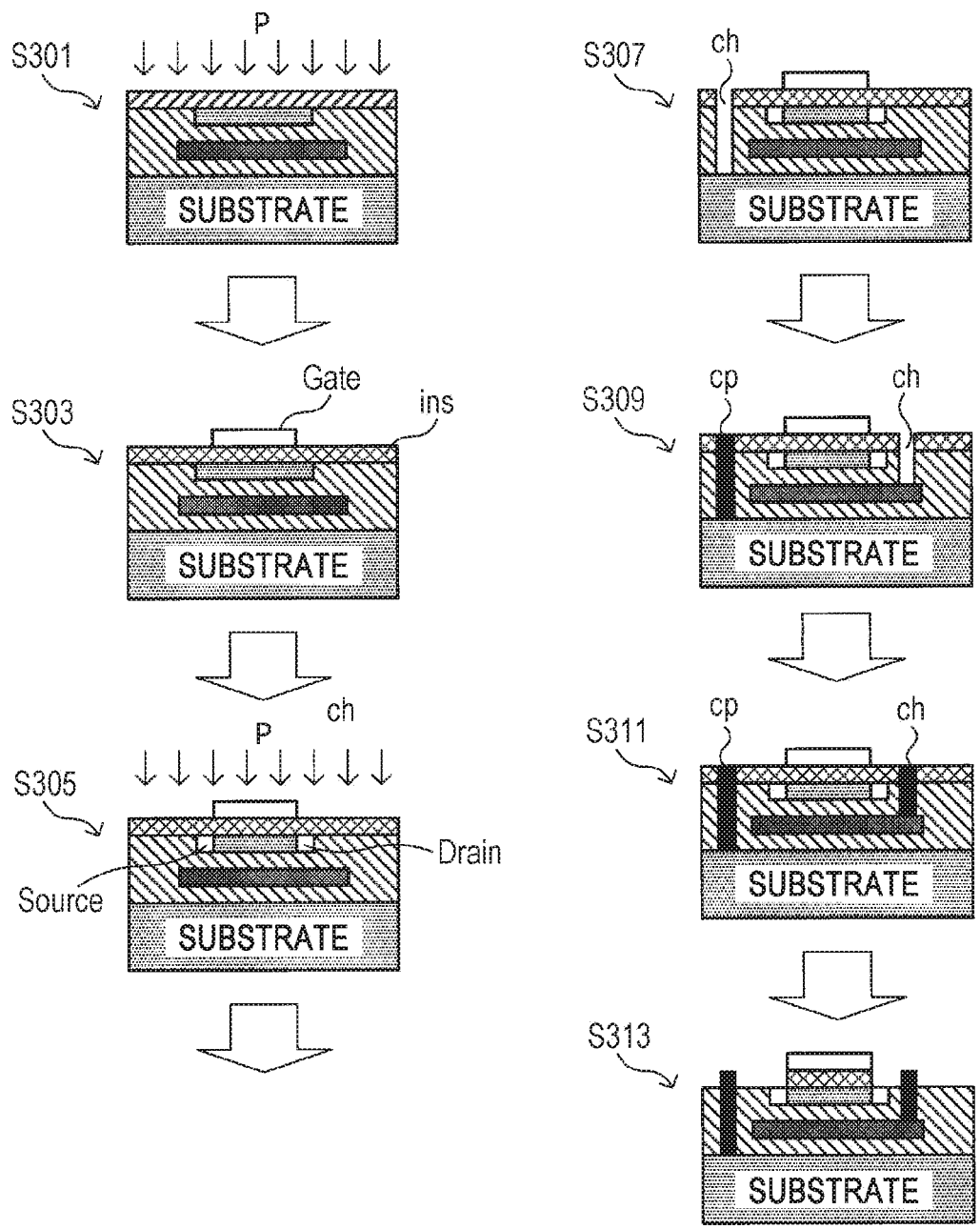
FIG. 10C is an explanatory diagram specifically illustrating an example of the method of manufacturing the semiconductor device according to the embodiment.

FIG. 9 is a flowchart illustrating an example of a flow of a method of manufacturing the semiconductor device according to the present embodiment. FIGS. 10A, 10B, and 10C are explanatory diagrams specifically illustrating an example of the method of manufacturing the semiconductor device according to the embodiment. FIGS. 11 to 16 are explanatory diagrams specifically illustrating another example of the method of manufacturing the semiconductor device according to the embodiment.

As illustrated in FIG. 9, the method of manufacturing the semiconductor device according to the present embodiment includes a step of forming a substrate material as a material of the semiconductor device (step S11), a step of forming the electromagnetic shield layer 30 using the obtained substrate material (step S21), and a step of forming the passive element 20 on the substrate material where the electromagnetic shield layer 30 has been formed (step S31).

The step of forming a substrate material (step S11) is more specifically a step of forming a substrate material having a stacked structure including a first insulating film layer located on a predetermined semiconductor substrate, a first semiconductor layer located on the first insulating film layer, a second insulating film layer located on the first semiconductor layer, and a second semiconductor layer located on the second insulating film layer, in which the stacked structure is device-isolated.

Furthermore, the step of forming the electromagnetic shield layer 30 (step S21) is a step of doping the first semiconductor layer in the substrate material to form the electromagnetic shield layer 30 electrically separated from the semiconductor substrate.

Furthermore, the step of forming the passive element 20 (step S31) is a step of forming a plurality of passive elements electrically connected one another, using the second semiconductor layer.

Hereinafter, each of these steps will be specifically described with reference to FIGS. 10A, 10B, and 10C. Note that, hereinafter, detailed description will be given, using a case of manufacturing the semiconductor device 1 according to the present embodiment using an Si-based semiconductor material, as an example. However, even in a case of manufacturing the semiconductor device 1 according to the present embodiment using another semiconductor material, the semiconductor device 1 according to the present embodiment can be manufactured similarly to below.

Manufacturing Example—Part 1: Using Smart Cut (Registered Trademark) Method

The manufacturing examples illustrated in FIGS. 10A, 10B, and 10C are specific examples of manufacturing the semiconductor device 1 according to the present embodiment (more specifically, the basic structure of the semiconductor device 1 according to the present embodiment, as illustrated in FIG. 6A), using the Smart Cut (registered trademark) method.

Formation of Substrate Material

In the present manufacturing example, first, as illustrated in FIG. 10A, a known Si substrate is prepared, and an oxide film ($SiO_2$) is generated on both surfaces of the Si substrate by a known method (step S101). Next, hydrogen ions ($H^+$) are implanted into the Si substrate on which the oxide film has been formed (step S103). Thereby, a hydrogen ion implanted region (the region illustrated with the broken line in FIG. 10A) is formed inside the Si substrate.

Thereafter, the obtained substrate is turned upside down so that a hydrogen ion implanted surface faces downward, and is then bonded with an Si substrate (favorably, a high-resistance Si substrate HR-Si)) as a support substrate (step S105).

A part of the Si substrate is separated from the hydrogen ion implanted region of the bonded body thus obtained by the Smart Cut (registered trademark) method, as illustrated in step S107. Thereby, an SOI substrate in which $SiO_2$ and Si are sequentially stacked on the Si substrate can be manufactured.

In the method of manufacturing the semiconductor device according to the present embodiment, the steps illustrated in steps S101 to S105 are performed again using the SOI substrate thus obtained as a support substrate, and the bonded body as illustrated in step S109 is manufactured. The Smart Cut (registered trademark) method is applied to the bonded body again, as illustrated in step S111, and a part of the Si substrate is separated from the hydrogen ion implanted region Thereby, an SOI-SOI substrate having $SiO_2$ (first insulating film layer), Si (first semiconductor layer), $SiO_2$ (second insulating film layer), and Si (second semiconductor layer) sequentially stacked on the Si substrate can be manufactured. Such an SOI-SOI substrate is the substrate material of the semiconductor device according to the present embodiment.

Formation of Electromagnetic Shield Layer

Next, as illustrated in FIG. 10B, a hard mask is deposited on the SOI-SOI structure using a chemical vapor deposition (CVD) method (step S201). Here, a known mask can be used as the hard mask. For example, $SiO_2/SiN/SiO_2$ deposited by 1 to 5 nm/10 to 100 nm/50 to 150 nm, respectively, can be used.

Thereafter, the first and second insulating film layers and the first and second semiconductor layers stacked on the semiconductor substrate are etched (step S203). Next, $SiO_2$ as an insulator is deposited on the etched portion, using a CVD method, to form a shallow trench isolation (STI) structure (step S205). Thereafter, the formed hard mask is removed by chemical mechanical polishing (CMP) or wet etching.

Next, to perform LOCOS oxidation, SiN is again deposited by the thickness of 10 to 100 nm and patterned as a mask (step S207), and the second semiconductor layer is LOCOS-oxidized (step S209). Thereafter, the SiN hard mask is removed by CMP or wet etching.

Next, $SiO_2$ as an ion implantation through film is deposited on the surface of the substrate material by, for example, about 1 to 10 nm by a CVD method (step S211). Thereafter, B (boron) ions are ion-implanted with energy that causes the first semiconductor layer to have a peak of an impurity profile, and the first semiconductor layer is set as the p-type electromagnetic shield layer 30 (step S213).

Here, the doping concentration of ions with respect to the first semiconductor layer is, as mentioned earlier, favorably equal to or less than $10^{16}$ cm$^{-3}$, more favorably equal to or less than $10^{14}$ cm$^{-3}$, and further more favorably less than $10^{12}$ cm$^{-3}$.

Furthermore, in the present manufacturing example, the case in which the electromagnetic shield layer 30 is made into a p-type has been described. However, instead of B ions, P (phosphorus) ions or As (arsenic) ions may be implanted to form the first semiconductor layer as an n-type electromagnetic shield layer 30.

Thus, the electromagnetic shield layer 30 of the semiconductor device 1 according to the present embodiment is formed.

Formation of Passive Element

Next, as illustrated in FIG. 10C, P ions or As ions are ion-implanted with energy that causes the second semiconductor layer to have a peak of the impurity profile, and the second semiconductor used as a channel layer of the passive element is made into an n-type (step S301). Thereafter, the ion implantation through film is separated by CMP or wet etching.

Next, a gate oxide film having the thickness of, for example, about 1 to 20 nm is formed as the insulator ins on the surface of the substrate material by a thermal oxidation method. Thereafter, PolySi is deposited by the thickness of about 100 to 200 nm and patterned by a chemical vapor deposition (CVD) method to form a gate electrode (Gate) (step S303).

Next, P ions are implanted into a source region and a drain region of the second semiconductor layer with energy of 10 to 20 keV so as to have the doping concentration of about 2 to $4 \times 10^{15}$ cm$^{-2}$. Note that although FIG. 10C does not illustrate a lightly-doped drain (LDD) implant, As ions are implanted as LDD implant with energy of 5 keV to have the doping concentration of about 1 to $2 \times 10^{14}$ cm$^{-2}$, if necessary.

Next, a contact hole ch for dropping the substrate to the Global GND is opened (step S307), and P having the concentration of, for example, about 1 to $4 \times 10^{15}$ cm$^{-2}$ is provided as a contact implant (not illustrated), and then a predetermined metal is buried as the contact plug cp (step S309). Next, a contact hole ch for dropping the electromagnetic shield layer 30 to a predetermined Local GND is opened to the electromagnetic shield layer 30 (step S309).

Next, for example, after B having the concentration of about 1 to $4 \times 10^{15}$ cm$^{-2}$ is provided as a contact implant (not illustrated), a predetermined metal is buried as the contact plug cp (step S311).

Finally, the source region and drain region are opened to form the source and drain electrodes (step S313). Thereby, the basic structure of the semiconductor device 1 according to the present embodiment as illustrated in FIG. 6A can be manufactured.

Manufacturing Example—Part 2: Using Smart Cut (Registered Trademark) Method

Next, a method of manufacturing a substrate material having a polycrystalline silicon layer (PolySi) functioning as a trap rich layer will be briefly described with reference to FIG. 11.

First, a known Si substrate is prepared, and an oxide film (SiO$_2$) and a polycrystalline silicon layer (PolySi) are generated on both surfaces of the Si substrate by a known method (step S121). Next, hydrogen ions (H$^+$) are implanted into the Si substrate on which the oxide film and the polycrystalline silicon layer have been formed (step S123). Thereby, a hydrogen ion implanted region (the region illustrated with the broken line in FIG. 11) is formed inside the Si substrate.

Thereafter, the obtained substrate is turned upside down so that a hydrogen ion implanted surface faces downward, and is then bonded with an Si substrate (favorably, a high-resistance Si substrate HR-Si)) as a support substrate (step S125).

A part of the Si substrate is separated from the hydrogen ion implanted region of the bonded body thus obtained by the Smart Cut (registered trademark) method, as illustrated in step S127. Thereby, an SOI substrate having PolySi, SiO$_2$, and Si sequentially stacked on the Si substrate and including the trap rich layer can be manufactured.

In the method of manufacturing the semiconductor device according to the present embodiment, the steps illustrated in steps S121 to S125 are performed again using the SOI substrate including the trap rich layer thus obtained as a support substrate, and the bonded body as illustrated in step S129 is manufactured. The Smart Cut (registered trademark) method is applied to the bonded body again, as illustrated in step S131, and a part of the Si substrate is separated from the hydrogen ion implanted region. Thereby, an SOI-SOI substrate having the trap rich layer (PolySi), SiO$_2$ (first insulating film layer), Si (first semiconductor layer), SiO$_2$ (second insulating film layer), and Si (second semiconductor layer) sequentially stacked on the Si substrate, and including the trap rich layer, can be manufactured. Such an SOI-SOI substrate including the trap rich layer is the substrate material of the semiconductor device according to the present embodiment.

Thereafter, the basic structure of the semiconductor device 1 according to the present embodiment provided with a trap rich layer, as described in FIG. 6B, can be manufactured by sequentially performing the steps illustrated in FIGS. 10B and 10C.

Manufacturing Example—Part 3: Using SIMOX Method

Figure 12:
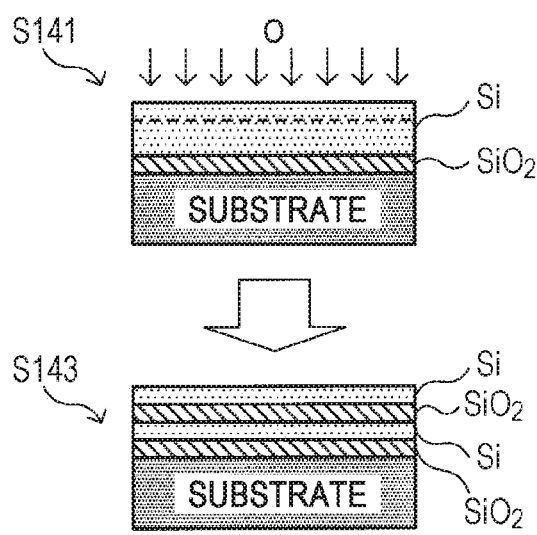
FIG. 12 is an explanatory diagram specifically illustrating another example of the method of manufacturing the semiconductor device according to the embodiment.

Next, a method of forming a substrate material using a separation by implantation of oxygen (SIMOX) method, instead of the Smart Cut (registered trademark) method, will be briefly described with reference to FIG. 12.

In the present manufacturing example, first, a known SOI substrate is prepared, and O (oxygen) ions are implanted into the SOI substrate (step S141). Thereafter, by annealing the SOI substrate into which O ions have been implanted at a high temperature of, for example, about 1300° C., a substrate material having an SOI-SOI structure can be obtained, as illustrated in step S143.

Thereafter, the basic structure of the semiconductor device 1 according to the present embodiment, as illustrated in FIG. 6A, can be manufactured by sequentially performing the steps illustrated in FIGS. 10B and 10C.

Manufacturing Example—Part 4: Using SIMOX Method

Figure 13:
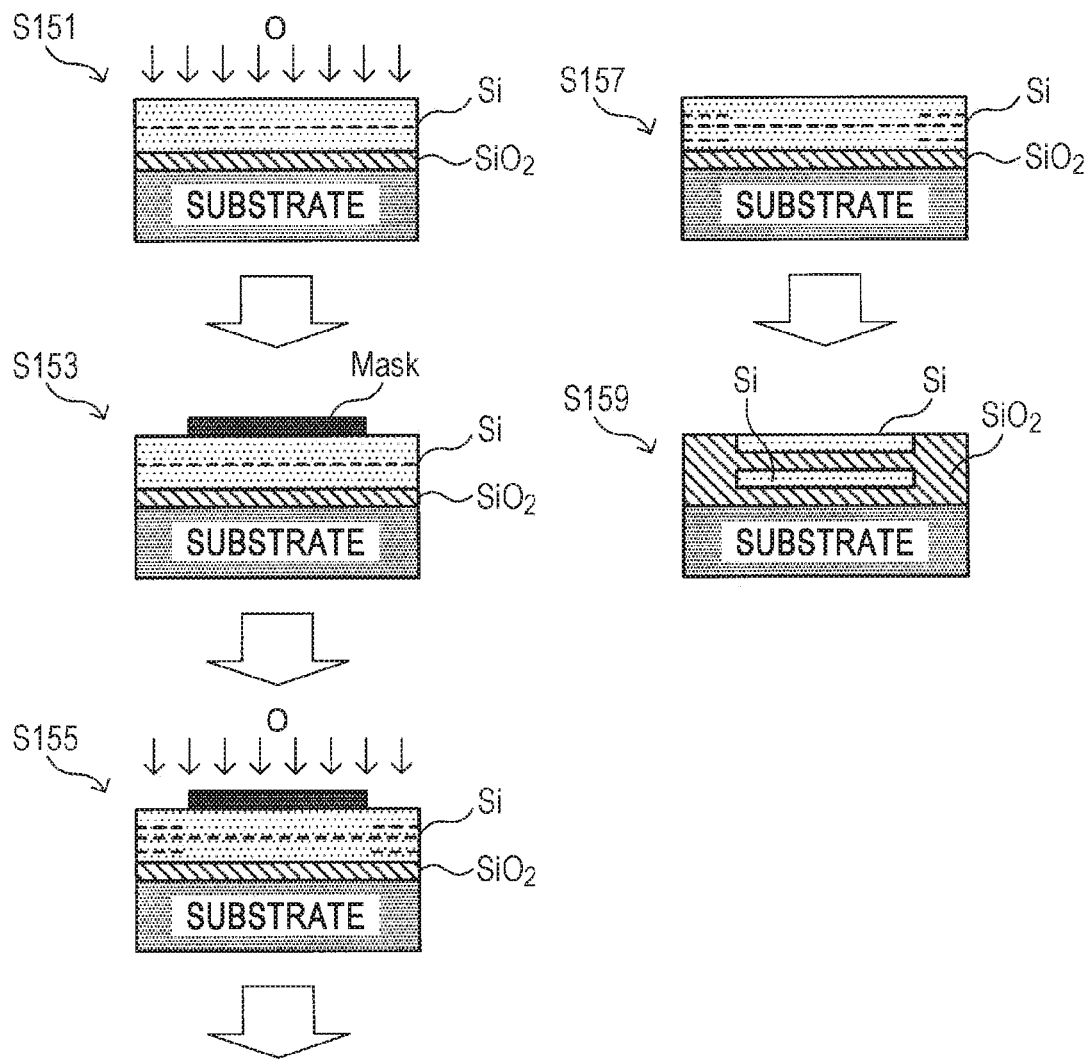
FIG. 13 is an explanatory diagram specifically illustrating another example of the method of manufacturing the semiconductor device according to the embodiment.
Figure 14:
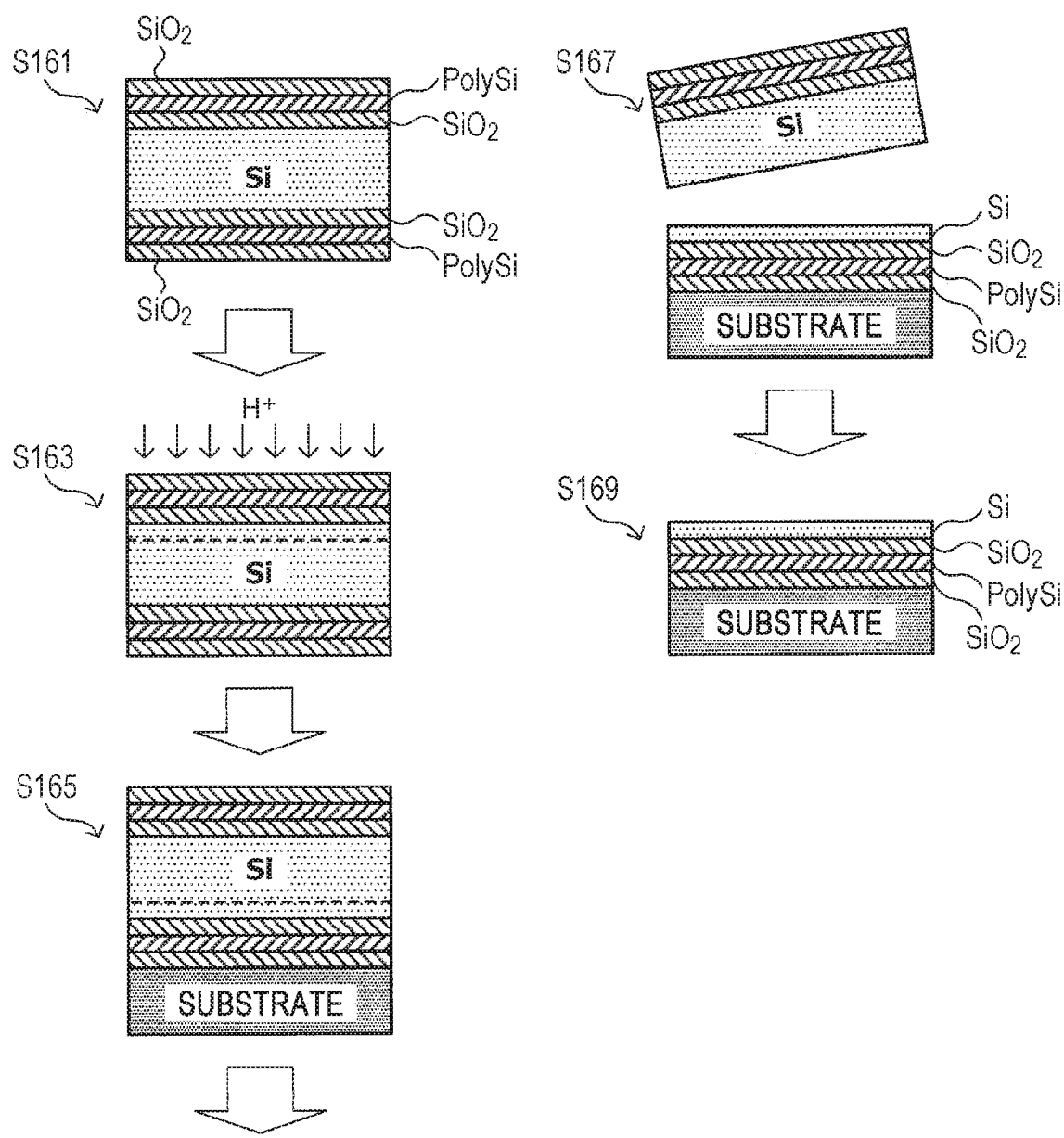
FIG. 14 is an explanatory diagram specifically illustrating another example of the method of manufacturing the semiconductor device according to the embodiment.

Next, another method of forming a substrate material using the separation by implantation of oxygen (SIMOX) method will be briefly described with reference to FIG. 13.

In the present manufacturing example, first, a known SOI substrate is prepared, and O (oxygen) ions are implanted into the SOI substrate (step S151). Thereafter, the SiN is deposited as a mask on the surface of the SOI substrate by a CVD method (step S153).

Next, after O ions are implanted again (step S155), SiN provided as a mask is removed by CMP or wet etching (step S157).

Next, by annealing the SOI substrate into which O ions have been implanted twice at the high temperature of, for example, about 1300° C., the substrate material having the SOI-SOI structure fabricated up to an STI structure can be obtained, as illustrated in step S159.

Thereafter, the basic structure of the semiconductor device 1 according to the present embodiment, as illustrated in FIG. 6A, can be manufactured by sequentially performing step S207 and the subsequent steps in FIG. 10B and the steps in FIG. 10C.

Manufacturing Example—Part 5: Formation of Electromagnetic Shield Layer Using Polycrystalline Silicon Next, a case of implementing a structure in which the first semiconductor layer illustrated in FIG. 10A is replaced with polycrystalline silicon (PolySi), instead of Si, will be briefly described with reference to FIG. 14.

In the present manufacturing example, first, a known Si substrate is prepared, and an oxide film (SiO$_2$), a polycrystalline silicon layer (PolySi), and an oxide film (SiO$_2$) are sequentially stacked on both surfaces of the Si substrate by a known method (step S161). Here, doping is favorably performed such that the doping concentration of the polycrystalline silicon layer becomes, as mentioned earlier, favorably equal to or less than $10^{16}$ cm$^{-3}$, more favorably equal to or less than $10^{14}$ cm$^{-3}$, and further more favorably less than $10^{12}$ cm$^{-3}$.

Next, hydrogen ions (H$^+$) are implanted into the obtained Si substrate (step S163). Thereby, a hydrogen ion implanted region (the region illustrated with the broken line in FIG. 14) is formed inside the Si substrate.

Thereafter, the obtained substrate is turned upside down so that a hydrogen ion implanted surface faces downward, and is then bonded with an Si substrate (favorably, a high-resistance Si substrate HR-Si)) as a support substrate (step S165).

A part of the Si substrate is separated from the hydrogen ion implanted region of the bonded body thus obtained by the Smart Cut (registered trademark) method, as illustrated in step S167 (step S169). Thereby, an SOI substrate having SiO$_2$ (first insulating film layer), PolySi (first semiconductor layer), SiO$_2$ (second insulating film layer), and Si (second semiconductor layer) sequentially stacked on the Si substrate can be manufactured.

Thereafter, the basic structure of the semiconductor device 1 according to the present embodiment, as illustrated in FIG. 6A, can be manufactured by sequentially performing the steps illustrated in FIGS. 10B and 10C.

Manufacturing Example—Part 6: High Mobility of Second Semiconductor Layer

Figure 11:
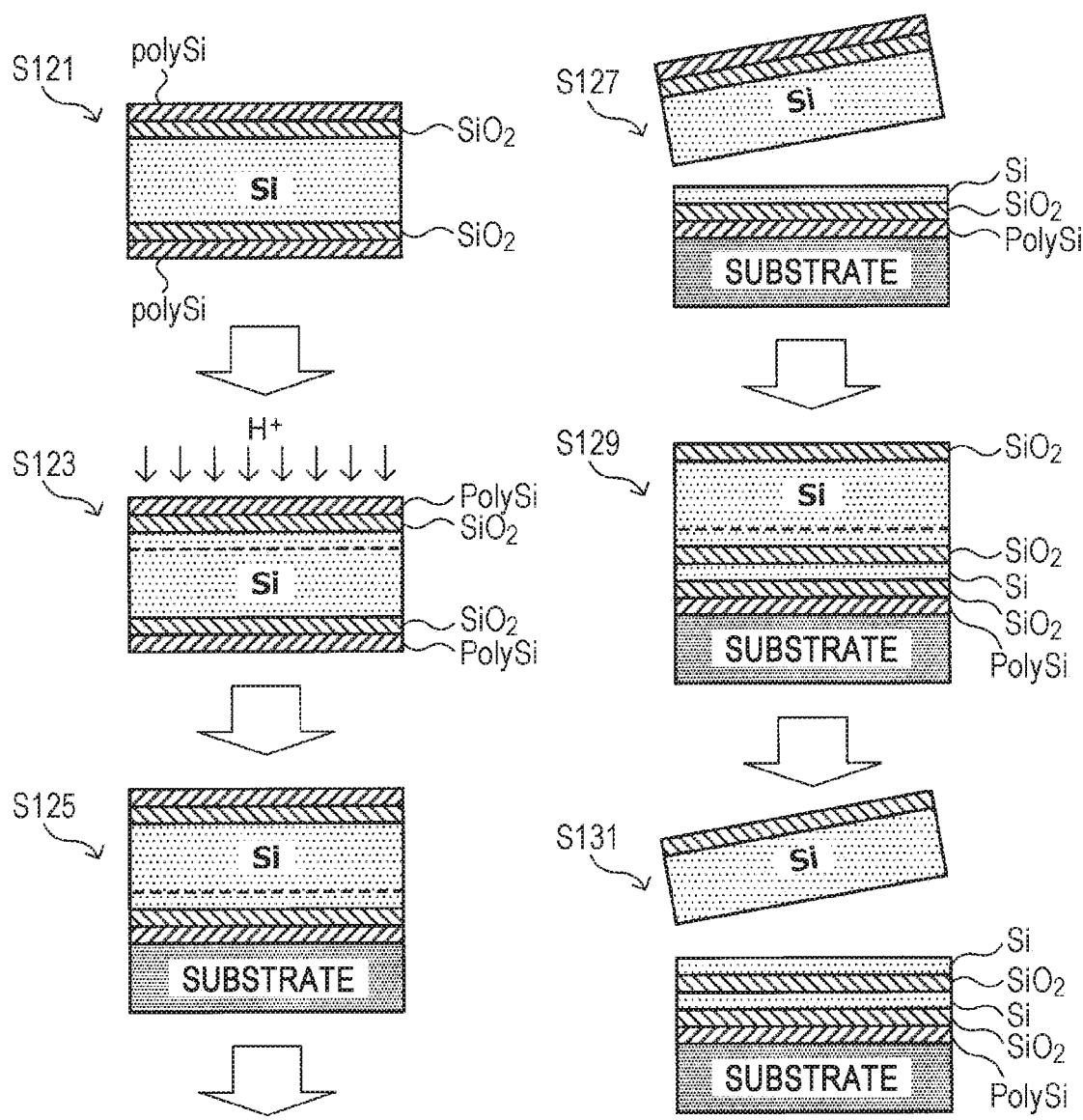
FIG. 11 is an explanatory diagram specifically illustrating another example of the method of manufacturing the semiconductor device according to the embodiment.

Next, an example of performing tensile-Si to achieve high mobility of the second semiconductor layer of the SOI-SOI structure obtained by the method illustrated in FIG. 11, using the method disclosed in Non-Patent Document (A. Bonnevialle etc., "Smart Solutions for Efficient Dual Strain Integration for Future FDSOI Generations", 2016, Symposium on VLSI Technology Digest) will be briefly described.

First, an SOI-SOI substrate having the trap rich layer (PolySi), SiO$_2$ (first insulating film layer), Si (first semiconductor layer), SiO$_2$ (second insulating film layer), and Si (second semiconductor layer) sequentially stacked, and including the trap rich layer, is prepared using the method illustrated in FIG. 11, or the like (step S171). Next, silicon germanium (SiGe) is epitaxially grown on the surface of the SOI-SOI substrate (step S173).

Figure 15:
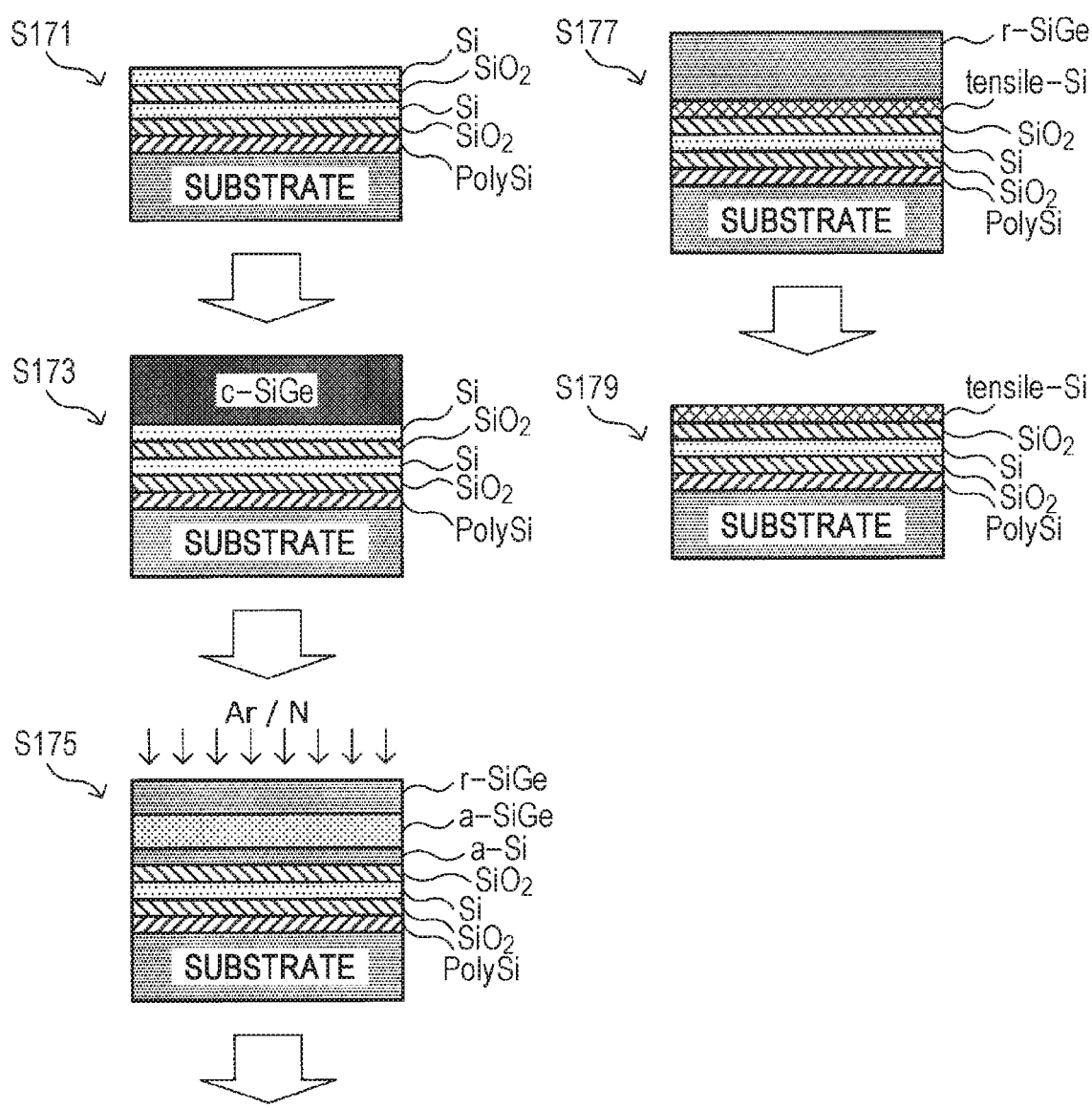
FIG. 15 is an explanatory diagram specifically illustrating another example of the method of manufacturing the semiconductor device according to the embodiment.
Figure 16:
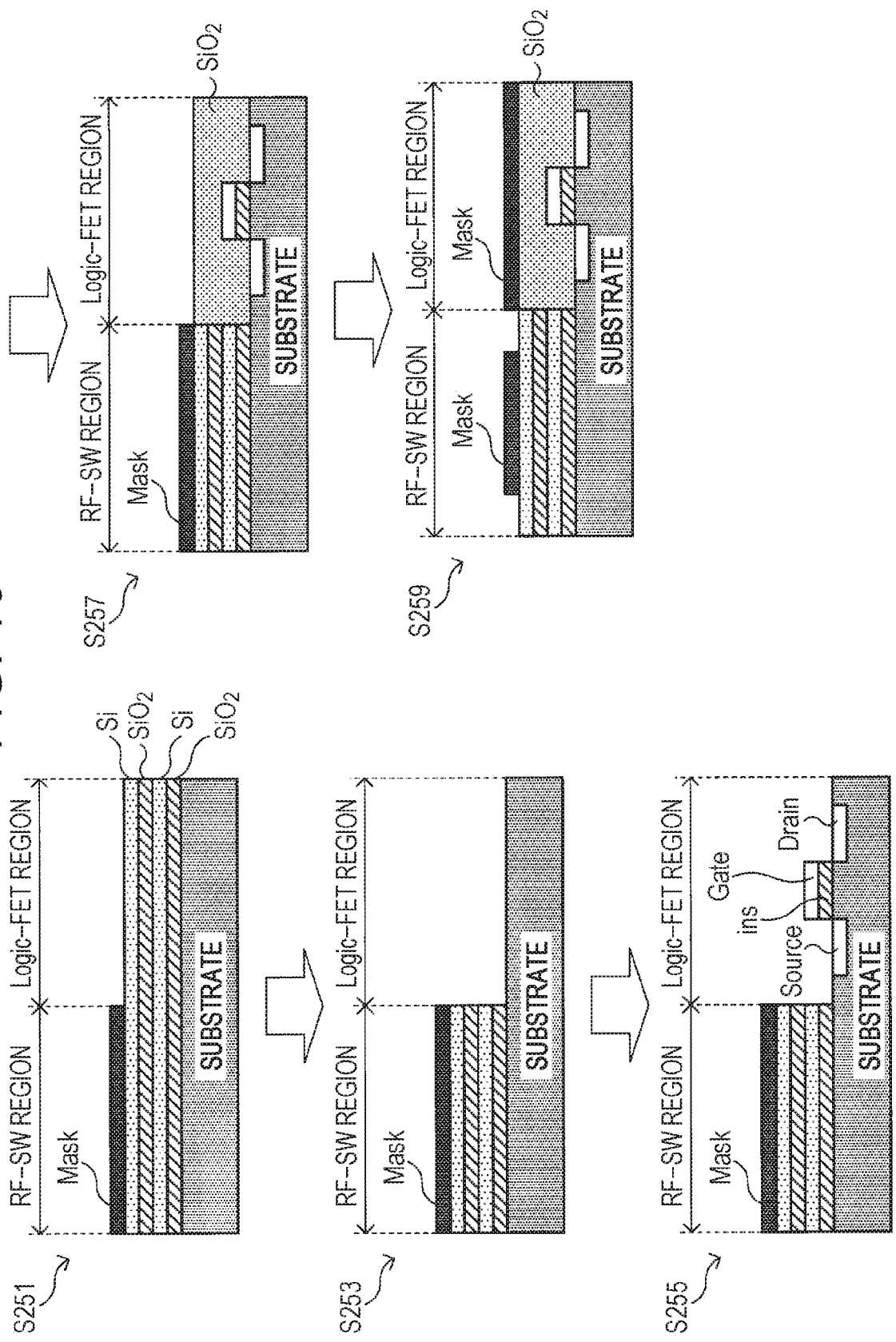
FIG. 16 is an explanatory diagram specifically illustrating another example of the method of manufacturing the semiconductor device according to the embodiment.

Next, Ar ions or N ions are implanted, and the second semiconductor layer and a part of SiGe are made amorphous (step S175, the notation "a-" in FIG. 15 means being made amorphous). Thereafter, the substrate is annealed and recrystallized from SiGe. By the annealing processing, Si of the second semiconductor layer changes to Tensile-Si exhibiting higher mobility (step S177).

Thereby, a substrate material having the SOI-SOI structure exhibiting high mobility, which includes the trap rich layer and has high mobility of the second semiconductor layer, as illustrated in step S179, can be obtained.

Thereafter, the basic structure of the semiconductor device 1 according to the present embodiment, as illustrated in FIG. 6A, can be manufactured by sequentially performing the steps illustrated in FIGS. 10B and 10C.

Note that, in the present manufacturing example, the SOI-SOI substrate including the trap rich layer has been used. However, the present manufacturing example can be also applied to an SOI-SOI substrate including no trap rich layer.

Manufacturing Example—Part 7: Method of Manufacturing Configuration Example Illustrated in FIG. 8B Next, a method of manufacturing a configuration in which the RF-SW region and the Logic-FET region are not present in the same Si layer and a level difference is present, as illustrated in FIG. 8B, will be briefly described with reference to FIG. 16.

First, an SOI-SOI substrate is manufactured using various methods as illustrated in FIG. 10A and the like. Next, a hard mask is deposited by a CVD method and patterned so as to cover a region where the RF-SW region is desired to be formed (step S251). Here, as the hard mask, for example, SiO$_2$/SiN/SiO$_2$ deposited by 1 to 5 nm/10 to 100 nm/50 to 150 nm, respectively, can be used.

Next, first and second dielectric film layers and first and second semiconductor layers of a portion corresponding to the Logic-FET region (that is, a portion not covered with the hard mask) are etched (step S253). At this stage, the Logic-FET region is etched.

Next, a logic transistor is formed by forming a source electrode, a drain electrode, and a gate electrode on the substrate (step S255).

Thereafter, SiO$_2$ is deposited by a CVD method to form an interlayer insulating film (step S257). Next, the hard mask formed on the RF-SW region is removed by CMP or wet etching.

Next, a hard mask is provided to prevent the Logic-FET region from being etched, and a hard mask for forming an STI structure in the RF-SW region is formed (step S259). The hard mask can be formed by being deposited and patterned by a CVD method. Here, as the hard mask, for example, SiO$_2$/SiN/SiO$_2$ deposited by 1 to 5 nm/10 to 100 nm/50 to 150 nm, respectively, can be used.

Thereafter, the semiconductor device 1 according to the present embodiment, as illustrated in FIG. 8B, can be manufactured by sequentially performing step S203 and the subsequent steps in FIG. 10B and the steps in FIG. 10C.

The method of manufacturing the semiconductor device according to the present embodiment has been described above in detail.

Application Example of Semiconductor Device 1

Figure 17:
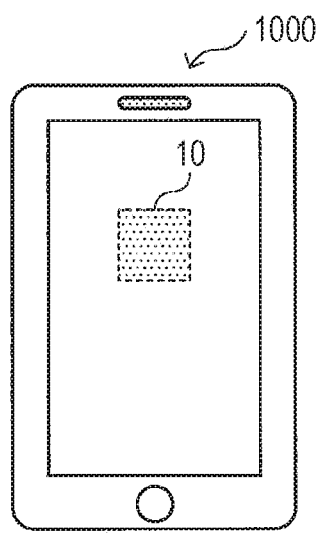
FIG. 17 is an explanatory diagram schematically illustrating an example of an electronic apparatus including the semiconductor device according to the embodiment.

Hereinafter, applications of the semiconductor device 1 according to the present embodiment will be briefly described with reference to FIG. 17. FIG. 17 is an explanatory diagram schematically illustrating an example of an electronic apparatus including the semiconductor device according to the present embodiment.

The semiconductor device 1 according to the present embodiment, as described above, can be favorably used for an RF switch, as mentioned earlier. Furthermore, the semiconductor device 1 can be used for various electronic apparatuses as illustrated in FIG. 17. Examples of such an electronic apparatus include various electronic apparatuses 1000 having a communication function, and specifically, mobile communication terminals such as mobile phones, smartphones, and tablet terminals, mobile music players, mobile game machines, various digital cameras, and notebook personal computers.

Although the favorable embodiment of the present disclosure has been described in detail with reference to the accompanying drawings, the technical scope of the present disclosure is not limited to such examples. It is obvious that persons having ordinary knowledge in the technical field of the present disclosure can conceive various changes and alterations within the scope of the technical idea described in the claims, and it is naturally understood that these changes and alterations belong to the technical scope of the present disclosure.

For example, in the above description, specific description has been made using an n-type semiconductor device. However, the semiconductor device according to the embodiment of the present disclosure can be also applied to a p-type semiconductor device.

Furthermore, the effects described in the present specification are merely illustrative or exemplary and are not restrictive. That is, the technology according to the present disclosure can exhibit other effects obvious to those skilled in the art from the description of the present specification together with or in place of the above-described effects.

Note that following configurations also belong to the technical scope of the present disclosure.

(1)
A semiconductor device including:
 a circuit substrate including an insulating film layer located above a predetermined semiconductor substrate and a semiconductor layer located above the insulating film layer;
 a plurality of passive elements provided on the circuit substrate and electrically connected with one another; and
 an electromagnetic shield layer locally provided in the insulating film layer corresponding to a portion where at least one of the plurality of passive elements is provided,
 the electromagnetic shield layer and the semiconductor substrate being electrically separated from each other.

(2)
The semiconductor device according to (1), in which the electromagnetic shield layer is provided in the insulating film layer so as not to straddle the plurality of passive elements.

(3)
The semiconductor device according to (1) or (2), in which the electromagnetic shield layer is formed using a material having conductivity or semiconductivity.

(4)
The semiconductor device according to any one of (1) to (3), in which the electromagnetic shield layer includes a semiconductor doped with p type or n type.

(5)
The semiconductor device according to (4), in which a doping concentration of the electromagnetic shield layer is equal to or less than $10^{16}$ cm$^{-3}$.

(6)
The semiconductor device according to any one of (1) to (5), in which a thickness of the electromagnetic shield layer is equal to or less than 100 nm.

(7)
The semiconductor device according to any one of (1) to (6), in which the electromagnetic shield layer is entirely provided, provided in a comb-like manner, or provided in a mesh-liked manner, in the insulating film layer corresponding to the portion where the passive element is provided.

(8)
The semiconductor device according to any one of (1) to (7), in which the semiconductor substrate and the electromagnetic shield layer are separately applied with a predetermined bias or are grounded.

(9)
The semiconductor device according to any one of (1) to (8), in which each of the plurality of passive elements includes at least one of a switching transistor, a power amplifier, a logic transistor, or an inductor independently of one another.

(10)
The semiconductor device according to (9), in which the electromagnetic shield layer is provided in the insulating film layer corresponding to the portion where the passive element functioning as at least the switching transistor is provided.

(11)
The semiconductor device according to (10), in which the electromagnetic shield layer is further provided in the insulating film layer corresponding to the portion where the passive element functioning as the logic transistor is provided.

(12)
The semiconductor device according to any one of (1) to (11), further including: a trap rich layer between the semiconductor substrate and the insulating film layer.

(13)
The semiconductor device according to (12), in which a doping concentration of the trap rich layer is equal to or less than $10^{16}$ cm$^{-3}$.

(14)
The semiconductor device according to any one of (1) to (13), in which a resistivity of the semiconductor substrate is over 500 Ωcm.

(15)
The semiconductor device according to any one of (1) to (14), in which the semiconductor substrate includes an Si substrate, a Ge substrate, an SiGe substrate, a group III-V semiconductor substrate, a group III nitride semiconductor substrate, or an SiC substrate.

(16)
The semiconductor device according to any one of (1) to (15), in which the semiconductor layer includes a layer containing Si, Ge, SiGe, a group III-V semiconductor, a group III nitride semiconductor, or SiC.

(17)
The semiconductor device according to any one of (1) to (16), in which the semiconductor device is used for an RF switch.

(18)
A method of manufacturing a semiconductor device, the method including:
forming a substrate material having a stacked structure including a first insulating film layer located on a predetermined semiconductor substrate, a first semiconductor layer located on the first insulating film layer, a second insulating film layer located on the first semiconductor layer, and a second semiconductor layer located on the second insulating film layer, the stacked structure being device-isolated;
doping the first semiconductor layer in the substrate material to form an electromagnetic shield layer electrically separated from the semiconductor substrate; and
forming a plurality of passive elements electrically connected with one another, using the second semiconductor layer.
(19)
The method of manufacturing a semiconductor device according to (18), in which the substrate material is manufactured by repeating a Smart Cut (registered trademark) method twice or by using a SIMOX method.
(20)
An electronic apparatus including:
a semiconductor device including
a circuit substrate including an insulating film layer located above a predetermined semiconductor substrate and a semiconductor layer located above the insulating film layer,
a plurality of passive elements provided on the circuit substrate and electrically connected with one another, and
an electromagnetic shield layer locally provided in the insulating film layer corresponding to a portion where at least one of the plurality of passive elements is provided,
the electromagnetic shield layer and the semiconductor substrate being electrically separated from each other.

REFERENCE SIGNS LIST

1 Semiconductor device
10 Circuit substrate
20 Passive element
30 Electromagnetic shield layer
101 Semiconductor substrate
103 Insulating film layer
105 Semiconductor layer
107 Trap rich layer

The invention claimed is:
1. A semiconductor device, comprising:
a circuit substrate including
an insulating film layer located above a specific semiconductor substrate, and
a semiconductor layer located above the insulating film layer;
a plurality of elements on the circuit substrate, wherein a first element of the plurality of elements is electrically connected with a second element of the plurality of elements; and
an electromagnetic shield layer in the insulating film layer corresponding to a first portion of the circuit substrate, wherein
the first element of the plurality of elements is in the first portion,
the electromagnetic shield layer is electrically separated from the specific semiconductor substrate, and
a doping concentration of the electromagnetic shield layer is equal to or less than $10^{16}$ cm$^{-3}$.

2. The semiconductor device according to claim 1, wherein the electromagnetic shield layer is in the insulating film layer so as not to straddle the plurality of elements.

3. The semiconductor device according to claim 1, wherein the electromagnetic shield layer includes a material having one of conductivity or semiconductivity.

4. The semiconductor device according to claim 1, wherein the electromagnetic shield layer includes a semiconductor doped with one of p type or n type.

5. The semiconductor device according to claim 1, wherein a thickness of the electromagnetic shield layer is equal to or less than 100 nm.

6. The semiconductor device according to claim 1, wherein the electromagnetic shield layer is in the insulating film layer in one of a sheet-like manner, a comb-like manner, or a mesh-like manner.

7. The semiconductor device according to claim 1, wherein the specific semiconductor substrate and the electromagnetic shield layer are one of separately applied with a specific bias or grounded.

8. The semiconductor device according to claim 1, wherein each element of the plurality of elements includes at least one of a switching transistor, a power amplifier, a logic transistor, or an inductor.

9. The semiconductor device according to claim 8, wherein
the electromagnetic shield layer is in the insulating film layer corresponding to the first portion which includes the first element which functions as the switching transistor.

10. The semiconductor device according to claim 9, wherein
the electromagnetic shield layer is in the insulating film layer corresponding to a second portion of the circuit substrate, and
the second portion includes the second element which functions as the logic transistor.

11. The semiconductor device according to claim 1, further comprising a trap rich layer between the specific semiconductor substrate and the insulating film layer.

12. The semiconductor device according to claim 11, wherein a doping concentration of the trap rich layer is equal to or less than $10^{16}$ cm$^{-3}$.

13. The semiconductor device according to claim 1, wherein a resistivity of the specific semiconductor substrate is over 500 Ωcm.

14. The semiconductor device according to claim 1, wherein the specific semiconductor substrate includes at least one of an Si substrate, a Ge substrate, an SiGe substrate, a group III-V semiconductor substrate, a group III nitride semiconductor substrate, or an SiC substrate.

15. The semiconductor device according to claim 1, wherein the semiconductor layer includes a layer containing at least one of Si, Ge, SiGe, a group III-V semiconductor, a group III nitride semiconductor, or SiC.

16. The semiconductor device according to claim 1, wherein the semiconductor device is used for a radio frequency (RF) switch.

17. A method of manufacturing a semiconductor device, the method comprising:
- forming a substrate material having a stacked structure including a first insulating film layer located on a specific semiconductor substrate, a first semiconductor layer located on the first insulating film layer, a second insulating film layer located on the first semiconductor layer, and a second semiconductor layer located on the second insulating film layer, the stacked structure being device-isolated;
- doping the first semiconductor layer in the substrate material to form an electromagnetic shield layer electrically separated from the specific semiconductor substrate; and
- forming a plurality of elements using the second semiconductor layer, wherein a first element of the plurality of elements is electrically connected to a second element of the plurality of elements.

18. The method according to claim 17, wherein the substrate material is manufactured by one of repeating a Smart Cut (registered trademark) method twice or using a separation by implantation of oxygen (SIMOX) method.

19. An electronic apparatus, comprising:
a semiconductor device including
- a circuit substrate including
  - an insulating film layer located above a specific semiconductor substrate and
  - a semiconductor layer located above the insulating film layer,
- a plurality of elements on the circuit substrate, wherein a first element of the plurality of elements is electrically connected with a second element of the plurality of elements, and
- an electromagnetic shield layer in the insulating film layer corresponding to a portion of the circuit substrate, wherein
  - at least one element of the plurality of elements is in the portion,
  - the electromagnetic shield layer is electrically separated from the specific semiconductor substrate,
  - the specific semiconductor substrate is connected to a global ground and the electromagnetic shield layer is connected to a local ground, and
  - a doping concentration of the electromagnetic shield layer is equal to or less than $10^{16}$ cm$^{-3}$.

* * * * *